United States Patent
Lee et al.

(10) Patent No.: US 12,127,438 B2
(45) Date of Patent: Oct. 22, 2024

(54) ELECTROLUMINESCENT DISPLAY DEVICE WITH A TOP ELECTRODE CONNECTED TO A CONNECTION ELECTRODE

(71) Applicant: LG DISPLAY CO., LTD., Seoul (KR)

(72) Inventors: Hak-Min Lee, Paju-si (KR); Hee-Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 494 days.

(21) Appl. No.: 17/476,092

(22) Filed: Sep. 15, 2021

(65) Prior Publication Data
US 2022/0173179 A1  Jun. 2, 2022

(30) Foreign Application Priority Data
Nov. 30, 2020  (KR) .................. 10-2020-0164873

(51) Int. Cl.
  H01L 27/32   (2006.01)
  H10K 59/122  (2023.01)
  H10K 59/35   (2023.01)

(52) U.S. Cl.
  CPC ......... *H10K 59/122* (2023.02); *H10K 59/353* (2023.02)

(58) Field of Classification Search
  CPC ........................... H10K 59/122; H10K 59/353
  See application file for complete search history.

(56) References Cited

U.S. PATENT DOCUMENTS

| | | | |
|---|---|---|---|
| 8,603,845 B2 | 12/2013 | Choi et al. | |
| 2004/0012058 A1 | 1/2004 | Aoki | |
| 2005/0212415 A1 | 9/2005 | Jung et al. | |
| 2007/0241664 A1 | 10/2007 | Sakamoto et al. | |
| 2011/0140114 A1 | 6/2011 | Ko et al. | |
| 2014/0120645 A1 | 5/2014 | Paek et al. | |
| 2015/0144906 A1 | 5/2015 | Ichikawa | |
| 2016/0043341 A1* | 2/2016 | Heo .............. | H10K 59/122 438/23 |

(Continued)

FOREIGN PATENT DOCUMENTS

EP   3840052 A1   6/2021
JP   2005149800 A   6/2005

(Continued)

OTHER PUBLICATIONS

Combined Search and Examination Report dated May 17, 2023 issued in corresponding UKIPO Application No. GB2115020.6.

(Continued)

*Primary Examiner* — Peter Bradford
(74) *Attorney, Agent, or Firm* — Morgan, Lewis & Bockius LLP

(57) ABSTRACT

An electroluminescent display device includes a substrate, a first electrode on the substrate, a connection pattern on the substrate and formed of a same material as the first electrode, a bank covering edges of the first electrode and the connection pattern, a light-emitting layer on the first electrode, a second electrode on the light-emitting layer, the bank, and the connection pattern, and an auxiliary pattern between the second electrode and the connection pattern, wherein a side surface of the auxiliary pattern has a greater inclination angle than a side surface of the bank.

22 Claims, 18 Drawing Sheets

(56) References Cited

U.S. PATENT DOCUMENTS

| | | | |
|---|---|---|---|
| 2016/0149155 A1* | 5/2016 | Kim | H10K 59/124 |
| | | | 438/23 |
| 2018/0006098 A1* | 1/2018 | Hong | H10K 59/1213 |
| 2018/0182989 A1 | 6/2018 | Paek et al. | |
| 2019/0198800 A1* | 6/2019 | Kim | H10K 59/122 |
| 2020/0127225 A1 | 4/2020 | Zhang et al. | |
| 2021/0193954 A1 | 6/2021 | Shin | |
| 2022/0278299 A1* | 9/2022 | Wang | H10K 59/122 |

FOREIGN PATENT DOCUMENTS

| | | | |
|---|---|---|---|
| JP | 2007287354 A | 11/2007 | |
| JP | 2012089534 A | 5/2012 | |
| JP | 2015103438 A | 6/2015 | |
| JP | 2019220289 A | 12/2019 | |
| KR | 10-2016-0047110 A | 5/2016 | |

OTHER PUBLICATIONS

Combined Search and Examination Report dated Jul. 17, 2022 issued in corresponding INPTO Application No. 202114047349.
Search and Examination Report dated Nov. 1, 2022 issued in corresponding Japan Patent Office Application No. 2021-164561.
Combined Search and Examination Report issued in corresponding UKIPO Patent Application No. GB2115020.6 dated Mar. 16, 2022.
Combined Search and Examination Report dated Dec. 21, 2022 issued in corresponding UK Application No. GB2115020.6.

* cited by examiner

ELECTROLUMINESCENT DISPLAY DEVICE WITH A TOP ELECTRODE CONNECTED TO A CONNECTION ELECTRODE

CROSS-REFERENCE TO RELATED APPLICATIONS

The present application claims priority from and the benefit under 35 U.S.C § 119(a) of Republic of Korea Patent Application No. 10-2020-0164873 filed on Nov. 30, 2020, which is hereby incorporated by reference in its entirety.

BACKGROUND

Technical Field

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green, and blue sub-pixels, and displays various color images by allowing the red, green, and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, embodiments of the present disclosure are directed to an electroluminescent display device that substantially obviates one or more of the problems due to limitations and disadvantages of the related art.

An aspect of the present disclosure is to provide an electroluminescent display device having a large size and high definition.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other of the inventive concepts, as embodied and broadly described herein, an electroluminescent display device comprises a substrate, a first electrode on the substrate, a connection pattern on the substrate and formed of a same material as the first electrode, a bank covering edges of the first electrode and the connection pattern, a light-emitting layer on the first electrode, a second electrode on the light-emitting layer, the bank, and the connection pattern, and an auxiliary pattern between the second electrode and the connection pattern, wherein a side surface of the auxiliary pattern has a greater inclination angle than a side surface of the bank.

In another aspect, an electroluminescent display device comprises a substrate, a first electrode on the substrate, a connection pattern on the substrate and formed of a same material as the first electrode, a bank covering edges of the first electrode and the connection pattern, a light-emitting layer on the first electrode, a second electrode on the light-emitting layer, the bank, and the connection pattern, and an auxiliary pattern between the second electrode and the connection pattern, wherein the light-emitting layer includes a first charge auxiliary layer, a light-emitting material layer, and a second charge auxiliary layer, and the second charge auxiliary layer is disposed between the auxiliary pattern and the second electrode, and wherein a thickness of the second charge auxiliary layer at a side surface of the auxiliary pattern is smaller than a thickness of the second charge auxiliary layer at a side surface of the bank.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this application, illustrate embodiments of the disclosure and together with the description serve to explain principles of the present disclosure.

DETAILED DESCRIPTION

Reference will now be made in detail to exemplary embodiments of the disclosure, examples of which are illustrated in the accompanying drawings.

An electroluminescent display device according to an embodiment of the present disclosure includes a plurality of pixels to display an image, and each of the plurality of pixels includes red, green, and blue sub-pixels. A pixel region corresponding to each sub-pixel can have a configuration shown in FIG. 1.

Figure 1:
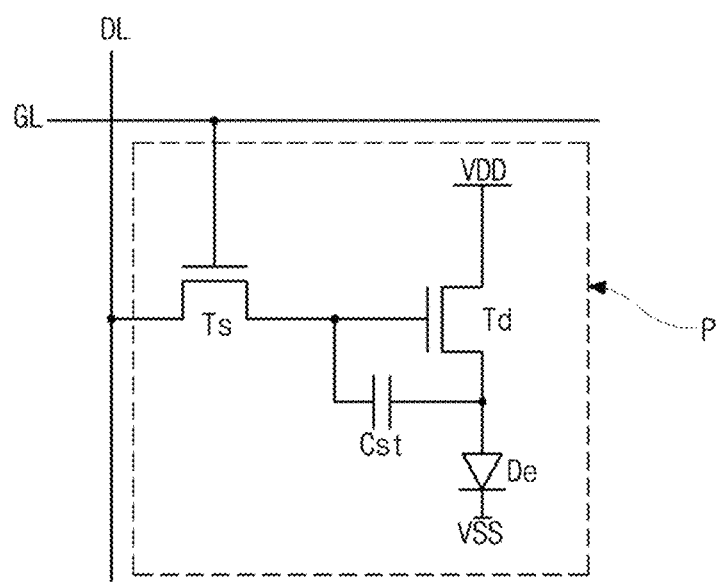
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

In the electroluminescent display device according to the embodiment of the present disclosure, the light-emitting diode De includes a first electrode, a light-emitting layer, and a second electrode. The first electrode, the light-emitting layer, and the second electrode can be sequentially formed over a substrate, and the switching thin film transistor Ts, the driving thin film transistor Td, and the storage capacitor Cst can be formed between the substrate and the first electrode. The electroluminescent display device according to the embodiment of the present disclosure can be a top emission type in which light from the light-emitting layer of the light-emitting diode De is output toward a direction opposite the substrate, that is, output to the outside through the second electrode. The top emission type display device can have a wider emission area than a bottom emission type display device of the same size, to thereby improve luminance and reduce power consumption.

To transmit light, the second electrode should be formed of a metal material so as to have a thin thickness or formed of a transparent conductive material. According to this, the resistance of the second electrode can increase, and a voltage drop can occur due to the resistance, thereby causing a problem of non-uniform brightness.

Therefore, in the present disclosure, the second electrode is electrically connected to an auxiliary electrode in order to decrease the resistance of the second electrode. At this time, the second electrode can be electrically connected to the auxiliary electrode through a connection pattern, and an auxiliary pattern can be formed between the connection pattern and the second electrode, so that the electrical contact property can be improved by decreasing the contact resistance between the connection pattern and the second electrode.

Figure 2:
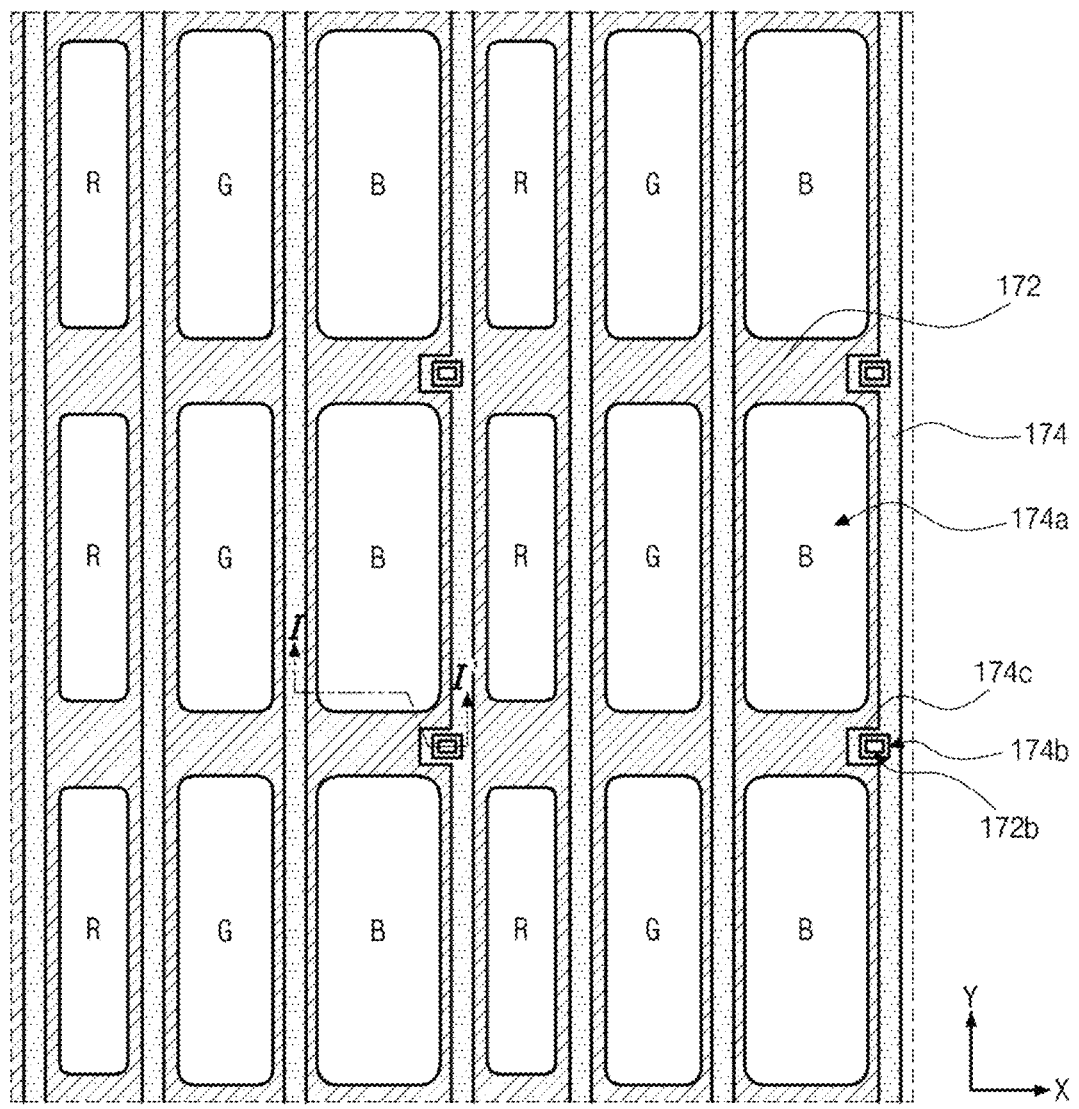
FIG. 2 is a schematic plan view of an electroluminescent display device according to an embodiment of the present disclosure.

FIG. 2 is a schematic plan view of an electroluminescent display device according to an embodiment of the present disclosure and mainly shows a bank configuration.

As shown in FIG. 2, in the electroluminescent display device according to the embodiment of the present disclosure, red, green, and blue sub-pixels R, G, and B are sequentially arranged along a first direction (X-axis direction), which is a horizontal direction in the context of the figure, and the same color sub-pixels R, G, and B are arranged along a second direction (Y-axis direction), which is perpendicular to the first direction (X-axis direction). The red, green, and blue sub-pixels R, G, and B constitute one pixel, and each of the red, green, and blue sub-pixels R, G, and B can have the circuit configuration of the pixel region P of FIG. 1.

Here, the red, green, and blue sub-pixels R, G, and B are shown to each have a rectangular shape with rounded corners, but is not limited thereto. Each of the red, green, and blue sub-pixels R, G, and B can have various shapes such as a rectangular shape with angled corners, an oval shape, or the like.

The red, green, and blue sub-pixels R, G, and B can have different sizes. The sizes of the red, green, and blue sub-pixels R, G, and B are determined by considering the lifetime of a light-emitting diode provided at each sub-pixel. For example, the size of the green sub-pixel G can be larger than the size of the red sub-pixel R and smaller than the size of the blue sub-pixel B. However, the present disclosure is not limited thereto. Alternatively, the red, green, and blue sub-pixels R, G, and B can have the same size.

The red, green, and blue sub-pixels R, G, and B can be defined by a bank. The bank includes a first bank 172 of a hydrophilic property and a second bank 174 of a hydrophobic property.

More specifically, the first bank 172 is disposed between adjacent same color sub-pixels R, G, and B and between adjacent different color sub-pixels R, G, and B. The first bank 172 can surround each of the sub-pixels R, G, and B.

Alternatively, the first bank 172 can be omitted between the adjacent different color sub-pixels R, G, and B. That is, the first bank 172 can extend along the first direction (X-axis direction) and can be formed only between the adjacent same color sub-pixels R, G and B along the second direction (Y-axis direction).

The second bank 174 is disposed on the first bank 172. The second bank 174 has an opening 174a corresponding to a same color sub-pixel column and is disposed between adjacent different color sub-pixels R, G and B along the first direction (X-axis direction).

Accordingly, the opening 174a extends in the second direction (Y-axis direction), and the opening 174a has a length of the second direction (Y-axis direction) longer than a length of the first direction (X-axis direction), that is, a width. The opening 174a has a short side parallel to the first direction (X-axis direction) and a long side parallel to the second direction (Y-axis direction). At this time, the second bank 174 can have a narrower width than the first bank 172 between the adjacent different color sub-pixels R, G and B along the first direction (X-axis direction).

In addition, the second bank 174 can have an extension part 174c extending in the first direction (X-axis direction). For example, the extension part 174c can be disposed between the adjacent blue sub-pixels B along the second direction (Y-axis direction) and can overlap the first bank 172.

Meanwhile, the first bank 172 and the second bank 174 can have first and second auxiliary contact holes 172b and 174b corresponding to the extension part 174c, respectively.

Here, one extension part 174c and one first and second auxiliary contact holes 172b and 174b can be formed to correspond to one pixel including the red, green, and blue sub-pixels R, G, and B. However, the present disclosure is not limited thereto, and the number and location of the extension part 174c and the first and second auxiliary contact holes 172b and 174b can be varied.

Although not shown in the figure, an auxiliary electrode and a connection pattern are formed to correspond to the extension part 174c where the first and second auxiliary contact holes 172b and 174b are formed, and the connection pattern is exposed through the first and second auxiliary contact holes 172b and 174b. In addition, an auxiliary pattern is formed between the connection pattern and the second electrode. Accordingly, the second electrode of the light-emitting diode is electrically connected to the auxiliary electrode through the connection pattern, and it is possible to decrease the contact resistance between the connection pattern and the second electrode due to the auxiliary pattern.

A configuration of the electroluminescent display device according to the embodiment of the present disclosure will be described in detail with reference to drawings.

First Embodiment

Figure 3:
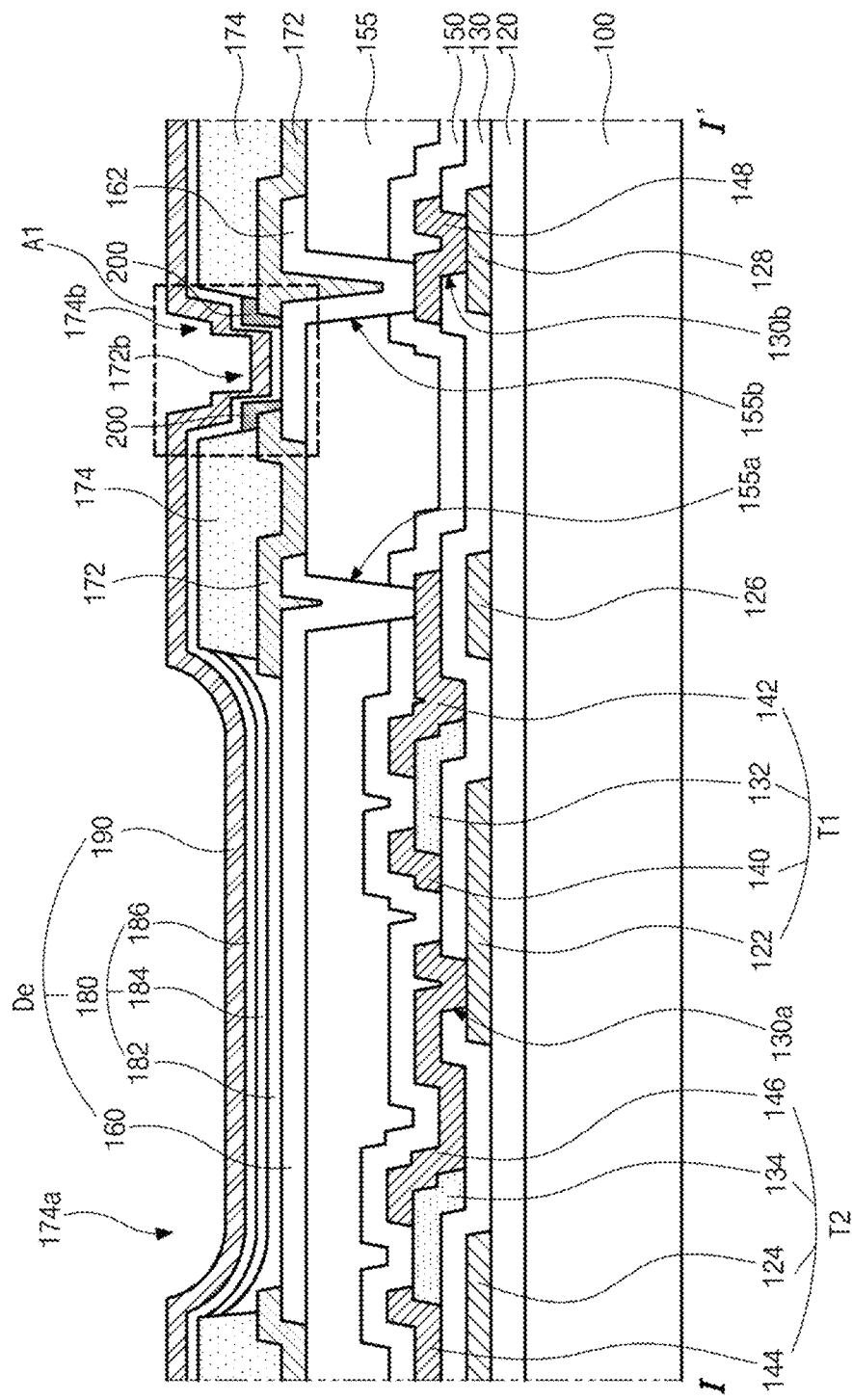
FIG. 3 is a schematic cross-sectional view of an electroluminescent display device according to a first embodiment of the present disclosure.

FIG. 3 is a schematic cross-sectional view of an electroluminescent display device according to a first embodiment of the present disclosure. FIG. 3 corresponds to the line I-I' of FIG. 2 and shows one pixel region.

In FIG. 3, a buffer layer 120 is formed substantially on an entire surface of a substrate 100. The substrate 100 can be a glass substrate or a plastic substrate. For example, polyimide can be used for the plastic substrate, but is not limited thereto.

The buffer layer 120 can be formed of an inorganic insulating material such as silicon oxide ($SiO_2$) or silicon nitride (SiNx) and can be formed as a single layer or multi layers.

A first gate electrode 122, a second gate electrode 124, a capacitor electrode 126, and a first auxiliary electrode 128 of a conductive material such as metal are formed on the buffer layer 120.

The first gate electrode 122, the second gate electrode 124, the capacitor electrode 126, and the first auxiliary electrode 128 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the first gate electrode 122, the second gate electrode 124, the capacitor electrode 126, and the first auxiliary electrode 128 can have a double-layered structure including a lower layer of a molybdenum-titanium alloy (MoTi) and an upper layer of copper (Cu), and the upper layer can have a thicker thickness than the lower layer.

Here, the first auxiliary electrode 128 can extend in a first direction (X-axis direction) parallel to the substrate 100 in a plan view. Accordingly, the first auxiliary electrode 128 can be formed to correspond to a plurality of pixel regions arranged along the first direction (X-axis direction). However, the present disclosure is not limited thereto.

Meanwhile, a gate line (not shown) can be further formed of the same material and on the same layer as the first and second gate electrodes 122 and 124. The gate line can extend in the first direction (X-axis direction), and in this case, the gate line and the first auxiliary electrode 128 can be parallel to each other.

A gate insulation layer 130 of an insulating material is formed on the first gate electrode 122, the second gate electrode 124, the capacitor electrode 126, and the first auxiliary electrode 128. The gate insulation layer 130 is disposed substantially on the entire surface of the substrate 100. The gate insulation layer 130 can be formed of an inorganic insulating material such as silicon oxide ($SiO_2$) or silicon nitride (SiNx).

The gate insulation layer 130 has a first contact hole 130a partially exposing the first gate electrode 122 and a second contact hole 130b partially exposing the first auxiliary electrode 128.

A first semiconductor layer 132 and a second semiconductor layer 134 are formed on the gate insulation layer 130. The first semiconductor layer 132 overlaps the first gate electrode 122, and the second semiconductor layer 134 overlaps the second gate electrode 124. The first and second semiconductor layers 132 and 134 are spaced apart from the first contact hole 130a, which is disposed between the first and second semiconductor layers 132 and 134.

The first and second semiconductor layers 132 and 134 can be formed of an oxide semiconductor material. In this case, it is beneficial that the gate insulation layer 130 is formed of silicon oxide ($SiO_2$).

Alternatively, the first and second semiconductor layers 132 and 134 can be formed of amorphous silicon.

First source and first drain electrodes 140 and 142 and second source and second drain electrodes 144 and 146 of a conductive material such as metal are formed on the first and second semiconductor layers 132 and 134.

More specifically, the first source electrode 140 and the first drain electrode 142 are formed on the first semiconductor layer 132, and the second source electrode 144 and the second drain electrode 146 are formed on the second semiconductor layer 134. The first source electrode 140 and the first drain electrode 142 overlap and contact the first semiconductor layer 132, and the second source electrode 144 and the second drain electrode 146 overlap and contact the second semiconductor layer 134.

The first source and first drain electrodes 140 and 142 and the second source and second drain electrodes 144 and 146 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the first source and first drain electrodes 140 and 142 and the second source and second drain electrodes 144 and 146 can have a double-layered structure including a lower layer of a molybdenum-titanium alloy (MoTi) and an upper layer of copper (Cu), and the upper layer can have a thicker thickness than the lower layer. Alternatively, the first source and first drain electrodes 140 and 142 and the second source and second drain electrodes 144 and 146 can have a triple-layered structure.

The first drain electrode 142 overlaps the capacitor electrode 126 to form a storage capacitor. In addition, the second drain electrode 146 overlaps the first gate electrode 122 and contacts the first gate electrode 122 through the first contact hole 130a.

The first gate electrode 122, the first semiconductor layer 132, the first source electrode 140, and the first drain electrode 142 form a first thin film transistor T1, and the second gate electrode 124, the second semiconductor layer 134, the second source electrode 144, and the second drain electrode 146 form a second thin film transistor T2.

The first and second thin film transistors T1 and T2 have an inverted staggered structure in which the gate electrode 122 and 124 is disposed under the semiconductor layer 132 and 134 and the source and drain electrodes 140, 142, 144, and 146 are located over the semiconductor layer 132 and 134.

Alternatively, the first and second thin film transistors T1 and T2 can have a coplanar structure in which the gate electrode and the source and drain electrodes are located at the same side with respect to the semiconductor layer, that is, over the semiconductor layer. In this case, the semiconductor layer can be formed of an oxide semiconductor material or polycrystalline silicon. When the semiconductor layer is formed of polycrystalline silicon, both ends of the semiconductor layer can be doped with impurities.

The first thin film transistor T1 corresponds to the driving thin film transistor Td of FIG. 1, and the second thin film transistor T2 corresponds to the switching thin film transistor Ts of FIG. 1. Although not shown in the figure, a sensing thin film transistor having the same structure as the first and second thin film transistors T1 and T2 can be further formed on the substrate 100.

Further, a second auxiliary electrode 148 is further formed on the gate insulation layer 130 and made of the same material as the first source and first drain electrodes 140 and 142 and the second source and second drain electrodes 144 and 146. The second auxiliary electrode 148 overlaps the first auxiliary electrode 128 and contacts the first auxiliary electrode 128 through the second contact hole 130b. The second auxiliary electrode 148 can extend in a second direction (Y-axis direction) crossing the first direction (X-axis direction), thereby corresponding to the plurality of pixel regions arranged along the second direction (Y-axis direction). However, the present disclosure is not limited thereto.

Meanwhile, a data line (not shown) and a high voltage supply line (not shown) can be further formed on the interlayer insulation layer and can be made of the first source and first drain electrodes 140 and 142 and the second source and second drain electrodes 144 and 146. The data line and the high voltage supply line can extend in the second direction (Y-axis direction). Accordingly, the data line and the high voltage supply line can be parallel to each other. Further, when the second auxiliary electrode 148 extends in the second direction (Y-axis direction), the second auxiliary electrode 148 can be parallel to the data line and the high voltage supply line.

Although not shown in the figure, a light-blocking pattern can be further formed between the substrate 100 and the buffer layer 120. The light-blocking pattern overlaps the first and second semiconductor layers 132 and 134 and blocks light incident on the first and second semiconductor layers 132 and 134, thereby preventing the first and second semiconductor layers 132 and 134 from deteriorating due to the light. At this time, a plurality of light-blocking patterns can overlap the first and second semiconductor layers 132 and 134, respectively. Alternatively, one light-blocking pattern can overlap both the first and second semiconductor layers 132 and 134.

The light-blocking pattern can be formed of a conductive material such as metal.

In addition, an auxiliary line (not shown) can be further formed of the same material as the light-blocking pattern. The auxiliary line can overlap the first and second auxiliary electrodes 128 and 148 and be electrically connected to the first and second auxiliary electrodes 128 and 148.

The auxiliary line can extend in the first direction (X-axis direction) and/or the second direction (Y-axis direction). For example, the auxiliary line can extend in the first direction (X-axis direction) and can correspond to the plurality of pixel regions arranged along the first direction (X-axis direction). Or, the auxiliary line can extend in the second direction (Y-axis direction) crossing the first direction (X-axis direction) and can correspond to the plurality of pixel regions arranged along the second direction (Y-axis direction). Alternatively, the auxiliary line can extend in the first and second directions (X-axis and Y-axis directions) and can have a lattice structure. However, the present disclosure is not limited thereto.

Next, a passivation layer 150 of an insulating material is formed on the first source and first drain electrodes 140 and 142, the second source and second drain electrodes 144 and 146, and the second auxiliary electrode 148 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to under layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the first drain electrode 142. Further, the passivation layer 150 and the overcoat layer 155 have a third contact hole 155b exposing the second auxiliary electrode 148.

A first electrode 160 having relatively high work function is formed on the overcoat layer 155. The first electrode 160 is in contact with the first drain electrode 142 through the drain contact hole 155a.

Although not shown in the figure, the first electrode 160 can have a multi-layered structure. For example, the first electrode 160 can include a first layer, a second layer, and a third layer sequentially stacked on the overcoat layer 155. According to this, the first layer can be in contact with the overcoat layer 155, and the second layer can be disposed between the first layer and the third layer.

Here, the third layer can be formed of a conductive material having relatively high work function and can be formed of a transparent conductive material such as indium tin oxide (ITO) or indium zinc oxide (IZO), for example. In addition, the second layer can be formed of a metal material having relatively high reflectance and can be formed of silver (Ag), aluminum (Al), or aluminum-palladium-copper (Al—Pd—Cu: APC) alloy, for example. Here, the work function of the third layer is higher than the work function of the second layer.

Meanwhile, the first layer is formed to improve the adhesion property between the second layer and the overcoat layer 155. The first layer can be formed of a transparent conductive material such as indium tin oxide (ITO) or indium zinc oxide (IZO), but is not limited thereto. The first layer can be omitted.

A thickness of the second layer can be greater than a thickness of the third layer. For example, the thickness of the second layer can be 80 nm to 100 nm, and the thickness of the third layer can be 10 nm to 80 nm. However, the present disclosure is not limited thereto. A thickness of the first layer can be smaller than the thickness of the second layer and can be smaller than or equal to the thickness of the third layer. For example, the thickness of the first layer can be 10 nm, but is not limited thereto.

In addition, a connection pattern 162 is formed on the overcoat layer 155 and is formed of the same material as the first electrode 160. According to this, the connection pattern 162 can include first, second and third layers. At this time, the second layer can be disposed between the first layer and the third layer, and the first layer can be disposed between the second layer and the substrate 100, more particularly, between the second layer and the overcoat layer 155. The connection pattern 162 is in contact with the second auxiliary electrode 148 through the third contact hole 155b.

Meanwhile, as stated above, when the first electrode 160 has a double-layered structure by omitting the first layer of the first electrode 160, the first layer of the connection pattern 162 is also omitted, so that the connection pattern 162 has a double-layered structure.

A bank of an insulating material is formed on the first electrode 160 and the connection pattern 162. The bank includes a first bank 172 of a hydrophilic property and a second bank 174 of a hydrophobic property.

More specifically, the first bank 172 overlaps and covers edges of the first electrode 160 and exposes a central portion of the first electrode 160. In addition, the first bank 172 also formed on the connection pattern 162 covers edges of the connection pattern 162 and has a first auxiliary contact hole 172b exposing a central portion of the connection pattern 162.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At this time, at least a top surface of the second bank 174 is hydrophobic, and a side surface of the second bank 174 can be hydrophobic or hydrophilic.

The second bank 174 has an opening 174a exposing the central portion of the first electrode 160. As stated above, the opening 174a of the second bank 174 can correspond to the same color sub-pixel column.

The second bank 174 is disposed on the first bank 172 with a narrower width than the first bank 172 and exposes edges of the first bank 172. In addition, a thickness of the second bank 174 can be larger than a thickness of the first bank 172.

The second bank 174 can be formed of an organic insulating material having a hydrophobic property. Alternatively, the second bank 174 can be formed of an organic insulating material having a hydrophilic property and subjected to a hydrophobic treatment.

Further, the second bank 174 has a second auxiliary contact hole 174b corresponding to the first auxiliary contact hole 172b, and the connection pattern 162 is exposed through the first and second auxiliary contact holes 172b and 174b.

The connection pattern 162 and the first and second auxiliary contact holes 172b and 174b can be omitted in other pixel regions. That is, the connection pattern 162 and the first and second auxiliary contact holes 172*b* and 174*b* can be formed in some pixel regions.

For example, one connection pattern 162, one first auxiliary contact hole 172*b*, and one second auxiliary contact hole 174*b* can be formed to correspond to a pixel including red, green and blue sub-pixels. At this time, the connection pattern 162, the first auxiliary contact hole 172*b*, and the second auxiliary contact hole 174*b* can be formed to correspond to the blue sub-pixel. However, the present disclosure is not limited thereto.

Meanwhile, only the first bank 172 can be disposed on other edges of the first electrode 160 not shown in the figure.

Additionally, the first bank 172 and the second bank 174 are formed of different materials and separated from each other in FIG. 3. However, the hydrophilic first bank 172 and the hydrophobic second bank 174 can be formed of the same material and formed as one body. For example, an organic material layer can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174 having different widths and different thicknesses.

A light-emitting layer 180 is formed on the first electrode 160 exposed through the opening 174*a*. The light-emitting layer 180 can include a first charge auxiliary layer 182, a light-emitting material layer 184, and a second charge auxiliary layer 186 that are sequentially positioned over the first electrode 160. The light-emitting material layer 184 can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). However, the present disclosure is not limited thereto.

Here, each of the first charge auxiliary layer 182 and the light-emitting material layer 184 can be formed through a solution process. Thus, the process can be simplified and a display device with a large size and high resolution can be provided. A spin coating method, an ink jet printing method, or a screen printing method can be used as the solution process, but the present disclosure is not limited thereto.

As described above, since the opening 174*a* of the second bank 174 is formed to correspond to the same color sub-pixel column, solutions dropped into respective pixel regions corresponding to the same color sub-pixel column through different nozzles are connected to each other, and each of the first charge auxiliary layer 182 and the light-emitting material layer 184 is formed by drying the solutions. Thus, the first charge auxiliary layers 182 or the light-emitting material layers 184 in adjacent pixel regions corresponding to the same color sub-pixel column are connected to each other and formed as one body. Accordingly, the deviation between the dropping amounts of the nozzles can be minimized, and the thicknesses of the thin films formed in the respective pixel regions can be uniform.

When the solution is dried, a drying speed of a solvent in a region adjacent to the second bank 174 is different from that in other regions. That is, the drying speed of the solvent in the region adjacent to the second bank 174 is faster than that in the other regions. Therefore, a height of each of the first charge auxiliary layer 182 and the light-emitting material layer 184 in the region adjacent to the second bank 174 can rise as it gets closer to the second bank 174.

Meanwhile, the second charge auxiliary layer 186 can be formed through a thermal evaporation process. Accordingly, the second charge auxiliary layer 186 can be formed substantially over the entire surface of the substrate 100. That is, the second charge auxiliary layer 186 can be formed on the top surface and the side surface of the second bank 174 and can also be formed on the connection pattern 162.

A second electrode 190 of a conductive material having relatively low work function is formed on the light-emitting layer 180, specifically, on the second charge auxiliary layer 186 substantially over the entire surface of the substrate 100. The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. For example, the second electrode 190 can have the thickness of 5 nm to 10 nm, but is not limited thereto.

Alternatively, the second electrode 190 can be formed of a transparent conductive material such as indium gallium oxide (IGO) or IZO, but is not limited thereto.

The first electrode 160, the light-emitting layer 180, and the second electrode 190 constitute a light-emitting diode De. The first electrode 160 can serve as an anode, and the second electrode 190 can serve as a cathode, but is not limited thereto.

At this time, the light-emitting diode De of each pixel region can have an element thickness for a micro-cavity effect corresponding to a wavelength of the emitted light, thereby increasing the light efficiency. Here, the element thickness can be a distance between the first electrode 160 and the second electrode 190.

Meanwhile, although not shown in the figure, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

As described above, the electroluminescent display device of the present disclosure can be the top emission type in which light from the light-emitting layer 180 of the light-emitting diode De is output toward a direction opposite the substrate 100, that is, output to the outside through the second electrode 190. The top emission type display device can have a wider emission area than the bottom emission type display device of the same size, to thereby improve luminance and reduce power consumption.

To transmit light, the second electrode 190 is formed of a metal material so as to have a thin thickness or formed of a transparent conductive material, so that the resistance of the second electrode 190 increases. Accordingly, to lower the resistance of the second electrode 190, the second electrode 190 of the present disclose is electrically connected to the connection pattern 162 through the first and second auxiliary contact holes 172*b* and 174*b*. Therefore, the second electrode 190 is electrically connected to the first and second auxiliary electrodes 128 and 148 through the connection pattern 162.

At this time, the second charge auxiliary layer 186 is disposed between the second electrode 190 and the connection pattern 162. Since the second charge auxiliary layer 186 has an insulating property and acts as a resistor, a contact property between the second electrode 190 and the connection pattern 162 is lowered. In addition, resistances acting on the first and second auxiliary contact holes 172b and 174b of respective pixel regions are not the same, thereby causing an emission difference between the pixel regions. Further, when the first electrode 160 and the connection pattern 162 include silver (Ag), there is a problem that the silver (Ag) flows out due to the high resistance between the second electrode 190 and the connection pattern 162.

However, in the present discloser, since the auxiliary pattern 200, which is also referred to as a conductive pattern, is formed between the second electrode 190 and the connection pattern 162, more particularly, between the second charge auxiliary layer 186 and the connection pattern 162, it is possible that the contact property between the second electrode 190 and the connection pattern 162 increases and the emission of each pixel region is uniform.

This will be described in detail with reference to FIG. 4 and FIG. 5.

Figure 4:
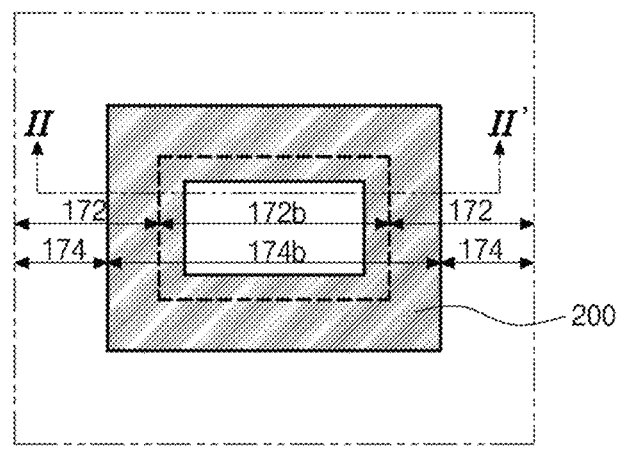
FIG. 4 is a schematic plan view enlarging an auxiliary pattern of an electroluminescent display device according to the first embodiment of the present disclosure corresponding to the area A1 of FIG. 3.
Figure 5:
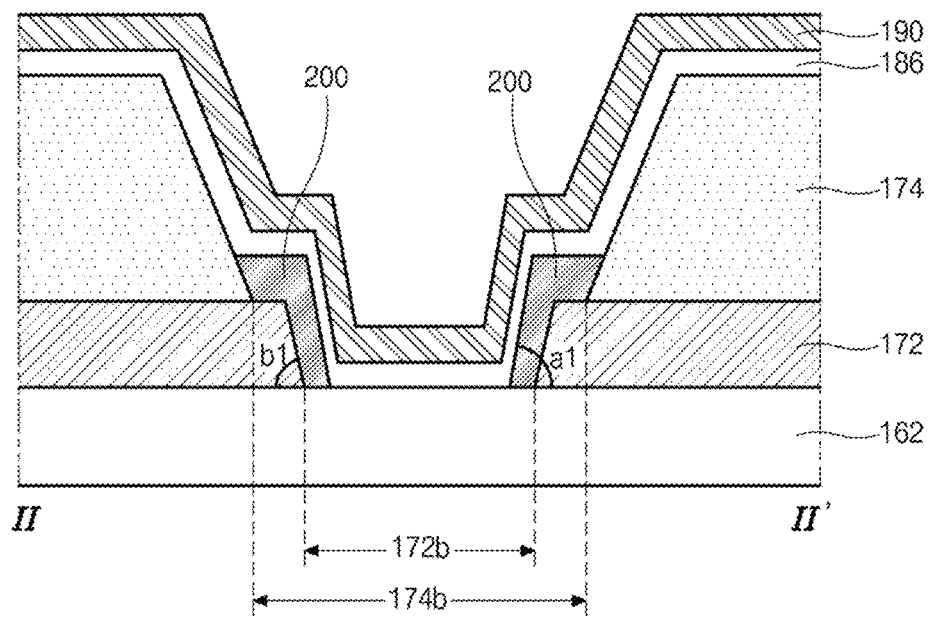
FIG. 5 is a cross-sectional view corresponding to the line II-IF of FIG. 4.

FIG. 4 and FIG. 5 are a schematic plan view and a schematic cross-sectional view enlarging the area A1 of FIG. 3, respectively. FIG. 4 is a top view illustrating a planar structure of an auxiliary pattern in an electroluminescent display device according to the first embodiment of the present disclosure, and FIG. 5 is a cross-sectional view corresponding to the line II-IF of FIG. 4.

In FIG. 4 and FIG. 5, the second charge auxiliary layer 186 is formed between the connection pattern 162 and the second electrode 190 corresponding to the first and second auxiliary contact holes 172b and 174b of the first and second banks 172 and 174, and the auxiliary pattern 200 is formed between the connection pattern 162 and the second charge auxiliary layer 186.

More particularly, the first bank 172 having the first auxiliary contact hole 172b and the second bank 174 having the second auxiliary contact hole 174b are sequentially formed on the connection pattern 162, and the connection pattern 162 is exposed through the first and second auxiliary contact holes 172b and 174b.

Next, the auxiliary pattern 200 is formed on the first and second banks 172 and 174 corresponding to the first and second auxiliary contact holes 172b and 174b. The auxiliary pattern 200 contacts the connection pattern 162 and covers and contacts the side surfaces of the first bank 172. In addition, the auxiliary pattern 200 can contact the top surface of the first bank 172 and the side surfaces of the second bank 174. Alternatively, the auxiliary pattern 200 can be in contact with the top surface of the first bank 172 and spaced apart from the side surfaces of the second bank 174 or can be spaced apart from the top surface of the first bank 172 and the side surfaces of the second bank 174.

The auxiliary pattern 200 is formed along edges of the first and second auxiliary contact holes 172b and 174b. Accordingly, the auxiliary pattern 200 exposes the top surface of the connection pattern 162, which is exposed through the first and second auxiliary contact holes 172b and 174b.

Here, the auxiliary pattern 200 is formed of a conductive material. For example, the auxiliary pattern 200 can be formed of a metal oxide such as ITO or IZO or formed of a metal having relatively low resistance under the atmosphere condition such as tungsten (W), chromium (Cr), titanium (Ti), molybdenum (Mo), nickel (Ni), or copper (Cu), but is not limited thereto.

Next, the second charge auxiliary layer 186 and the second electrode 190 are sequentially formed on the exposed connection pattern 162, the auxiliary pattern 200, and the second bank 174.

In the present disclosure, the side surfaces of the auxiliary pattern 200 have a greater inclination angle than the side surfaces of the first bank 172. That is, the side surfaces of the auxiliary pattern 200 have a first inclination angle a1 with respect to the top surface of the connection pattern 162 parallel to the substrate 100 of FIG. 3, and the side surfaces of the first bank 172 have a second inclination angle b1 with respect to the top surface of the connection pattern 162 parallel to the substrate 100 of FIG. 3. The first inclination angle a1 is greater than the second inclination angle b1. The side surfaces of the auxiliary pattern 200 can have a normal inclination where the first inclination angle a1 is smaller than 90 degrees. For example, the first inclination angle a1 can be equal to or greater than 75 degrees and smaller than 90 degrees, but is not limited thereto.

In addition, the first inclination angle a1 of the side surfaces of the auxiliary pattern 200 can be greater than an inclination angle of the side surfaces of the second bank 174. At this time, the inclination angle of the side surfaces of the second bank 174 can be smaller than the second inclination angle b1 of the side surfaces of the first bank 172, but is not limited thereto.

Since the side surfaces of the auxiliary pattern 200 have relatively the large inclination angle, the thickness of the second charge auxiliary layer 186 at the side surfaces of the auxiliary pattern 200 is thinner than the thickness of the second charge auxiliary layer 186 at other portions. That is, the thickness of the second charge auxiliary layer 186 at the side surfaces of the auxiliary pattern 200 is smaller than the thickness of the second charge auxiliary layer 186 at the top and side surfaces of the second bank 174 and smaller than the thickness of the second charge auxiliary layer 186 contacting the connection pattern 162.

Accordingly, the thickness of the second charge auxiliary layer 186 between the auxiliary pattern 200 and the second electrode 190 at the side surfaces of the auxiliary pattern 200 is smaller than the thickness of the second charge auxiliary layer 186 between the connection pattern 162 and the second electrode 190. Namely, the distance between the auxiliary pattern 200 and the second electrode 190 at the side surfaces of the auxiliary pattern 200 is shorter than the distance between the connection pattern 162 and the second electrode 190. Since the contact resistance decreases as the distance between two conductive layers decreases, thereby resulting in an ohmic characteristic, the contact resistance between the auxiliary pattern 200 and the second electrode 190 is smaller than the contact resistance between the connection pattern 162 and the second electrode 190.

Accordingly, the auxiliary pattern 200 according to the first embodiment of the present disclosure shortens the distance from the second electrode 190 compared with the connection pattern 162 and contacts the connection pattern 162, so that the contact resistance between the second electrode 190 and the connection pattern 162 can be decreased.

It is beneficial that a height of the auxiliary pattern 200, that is, a distance from the top surface of the connection pattern 162 to the top surface of the auxiliary pattern 200 is greater than a sum of the thicknesses of the second charge auxiliary layer 186 and the second electrode 190. For example, the height of the auxiliary pattern 200 can be 1 μm to 1.5 μm, but is not limited thereto.

As described above, in the electroluminescent display device according to the first embodiment of the present disclosure, by forming some of the light-emitting layer 180 through the solution process, a fine metal mask can be omitted to thereby reduce the manufacturing costs, and a display device with a large size and high definition can be implemented.

In addition, the electroluminescent display device according to the first embodiment of the present disclosure can be configured as the top emission type, thereby improving luminance and reducing power consumption. Here, the second electrode 190 has relatively thin thickness in order to transmit light and its resistance increases. However, the second electrode 190 is connected to the first and second auxiliary electrodes 128 and 148 through the connection pattern 162, so that the resistance of the second electrode 190 can be decreased.

At this time, since the auxiliary pattern 200 of a conductive material is formed between the second electrode 190 and the connection pattern 162, more particularly, between the second charge auxiliary layer 186 and the connection pattern 162, it is possible to increase the contact property between the second electrode 190 and the connection pattern 162.

Meanwhile, one of the first and second auxiliary electrodes 128 and 148 can be omitted.

The auxiliary pattern 200 can be formed through a mask process. If a conductive material is directly deposited on the first electrode 160 and then patterned, the first electrode 160 may be damaged, and the emission area can be affected. Accordingly, the present disclosure provides a method of forming the auxiliary pattern 200 while protecting the emission area.

A method of manufacturing the electroluminescent display device according to the first embodiment of the present disclosure will be described in detail with reference to FIGS. 6A to 6J.

FIGS. 6A to 6J are cross-sectional views schematically illustrating the electroluminescent display device in steps of a manufacturing process of the same according to the first embodiment of the present disclosure.

Figure 6A:
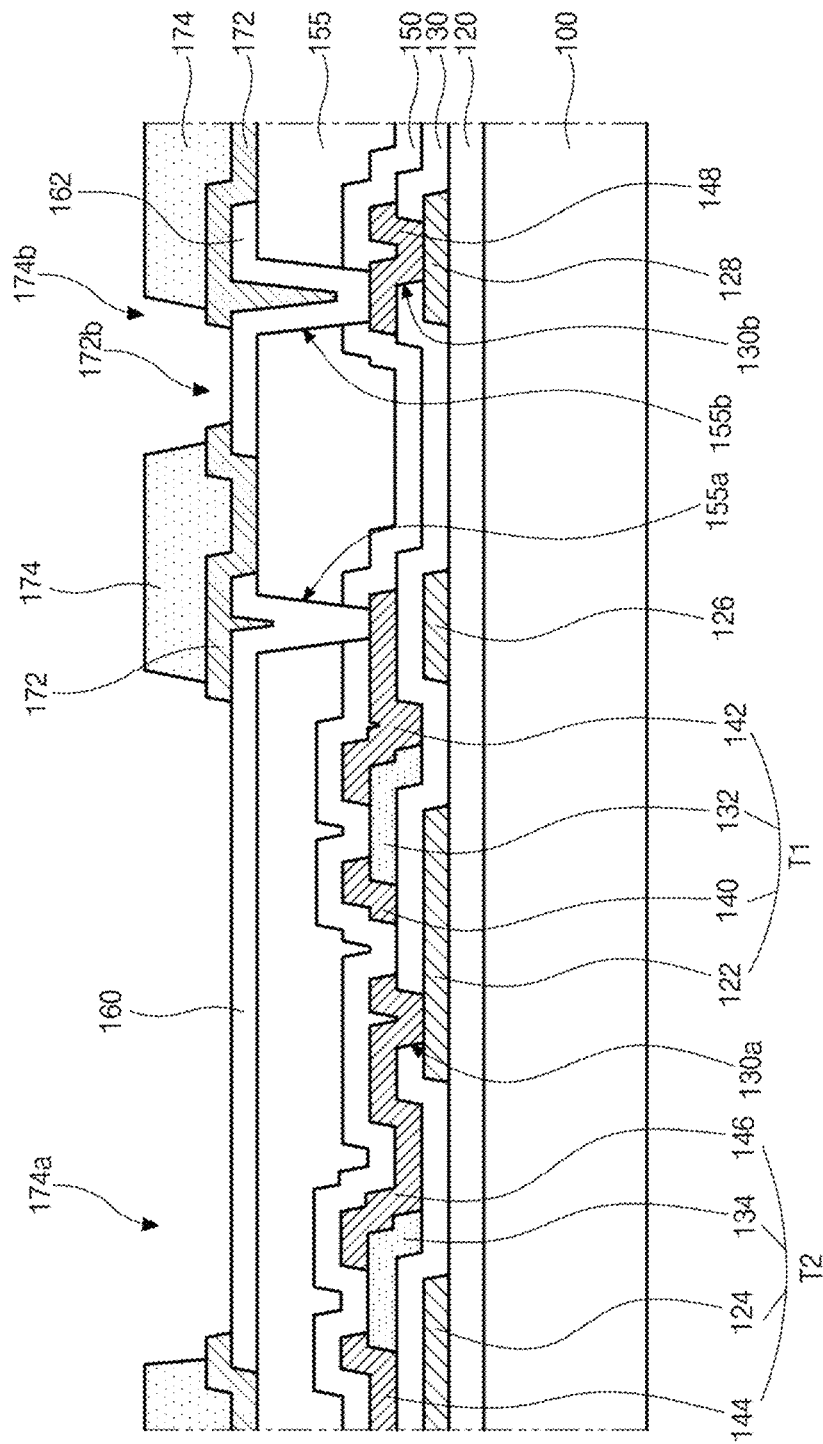
FIGS. 6A to 6J are cross-sectional views schematically illustrating the electroluminescent display device in steps of a manufacturing process of the same according to the first embodiment of the present disclosure.

In FIG. 6A, a buffer layer 120 is formed substantially on an entire surface of a substrate 100 by deposing an inorganic insulating material. Then, a first gate electrode 122, a second gate electrode 124, a capacitor electrode 126, and a first auxiliary electrode 128 are formed on the buffer layer 120 by depositing a conductive material and patterning it through a mask process.

Next, a gate insulation layer 130 is formed on the first gate electrode 122, the second gate electrode 124, the capacitor electrode 126, and the first auxiliary electrode 128 by depositing an inorganic insulating material, and the gate insulation layer 130 is patterned through a mask process to thereby form a first contact hole 130a exposing the first gate electrode 122 and a second contact hole 130b exposing the first auxiliary electrode 128.

Next, a first semiconductor layer 132 and a second semiconductor layer 134 are formed on the gate insulation layer 130 by depositing a semiconductor material and patterning it through a mask process. The first semiconductor layer 132 overlaps the first gate electrode 122, and the second semiconductor layer 134 overlaps the second gate electrode 124.

Here, the semiconductor material can be an oxide semiconductor material or amorphous silicon.

Next, first source and first drain electrodes 140 and 142, second source and second drain electrodes 144 and 146, and a second auxiliary electrode 148 are formed on the first and second semiconductor layers 132 and 134 by depositing a conductive material and patterning it through a mask process.

The first source electrode 140 and the first drain electrode 142 overlap and contact the first semiconductor layer 132, and the second source electrode 144 and the second drain electrode 146 overlap and contact the second semiconductor layer 134. Here, the first drain electrode 142 overlaps the capacitor electrode 126 to form a storage capacitor. The second drain electrode 146 overlaps the first gate electrode 122 and contacts the first gate electrode 122 through the first contact hole 130a.

The first gate electrode 122, the first semiconductor layer 132, the first source electrode 140, and the first drain electrode 142 form a first thin film transistor T1, and the second gate electrode 124, the second semiconductor layer 134, the second source electrode 144, and the second drain electrode 146 form a second thin film transistor T2.

Further, the second auxiliary electrode 148 overlaps the first auxiliary electrode 128 and contacts the first auxiliary electrode 128 through the second contact hole 130b.

Next, a passivation layer 150 is formed on the first source and first drain electrodes 140 and 142, the second source and second drain electrodes 144 and 146, and the second auxiliary electrode 148 by depositing an inorganic insulating material, and an overcoat layer 155 is formed on the passivation layer 150 by applying an organic insulating material. Then, the overcoat layer 155 and the passivation layer 150 are patterned through a mask process to thereby form a drain contact hole 155a and a third contact hole 155b.

The drain contact hole 155a exposes a part of the first drain electrode 142, and the third contact hole 155b exposes a part of the second auxiliary electrode 148.

Here, it is described that the passivation layer 150 and the overcoat layer 155 are patterned through the same mask process, but the passivation layer 150 and the overcoat layer 155 can be patterned through different mask processes. That is, after the passivation layer 150 is formed by depositing an inorganic insulating material and patterned through a mask process, the overcoat layer 155 can be formed by applying an organic insulating material and patterned through another mask process.

Next, a first electrode 160 and a connection pattern 162 are formed on the overcoat layer 155 by depositing a conductive material and patterning it through a mask process.

The first electrode 160 is in contact with the first drain electrode 142 through the drain contact hole 155a, and the connection pattern 162 is in contact with the second auxiliary electrode 148 through the third contact hole 155b.

The first electrode 160 and the connection pattern 162 each can have a multi-layered structure. For example, each of the first electrode 160 and the connection pattern 162 can include a first layer, a second layer, and a third layer, and a first conductive layer, a second conductive layer, and a third conductive layer can be sequentially formed and patterned, thereby forming the first electrode 160 and the connection pattern 162 having the first, second, and third layers. Here, the second conductive layer can be formed of silver (Ag). In addition, the first and third layers can be formed of ITO or IZO, but is not limited thereto.

Next, a first bank 172 of a hydrophilic property is formed on the first electrode 160 and the connection pattern 162 by depositing an inorganic insulating material and patterning it through a mask process. The first bank 172 overlaps and covers edges of the first electrode 160 and exposes a central portion of the first electrode 160. In addition, the first bank 172 covers edges of the connection pattern 162 and has a first auxiliary contact hole 172b exposing a central portion of the connection pattern 162.

Then, a second bank 174 of a hydrophobic property is formed on the first bank 172 by applying an organic insulating material and patterning it through a mask process. The second bank 174 is disposed on the first bank 172 with a narrower width than the first bank and exposes edges of the first bank 172. The second bank 174 has an opening 174a exposing the central portion of the first electrode 160. In addition, the second bank 174 has a second auxiliary contact hole 174b corresponding to the first auxiliary contact hole 172b, and the connection pattern 162 is exposed through the first and second auxiliary contact holes 172b and 174b.

The second bank 174 can be formed of a material having a negative photosensitivity in which a portion exposed to light remains after developing. Alternatively, the second bank 174 can be formed of a material having a positive photosensitivity in which a portion not exposed to light remains after developing.

Meanwhile, it is described that the hydrophilic first bank 172 and the hydrophobic second bank 174 are formed through respective mask processes, but the first bank 172 and the second bank 174 can be formed through the same mask process. For example, an organic material layer can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174 configured as one body and having different widths and different thicknesses. Alternatively, the organic material layer can have a hydrophilic property and can be subjected to a hydrophobic treatment.

Figure 6B:
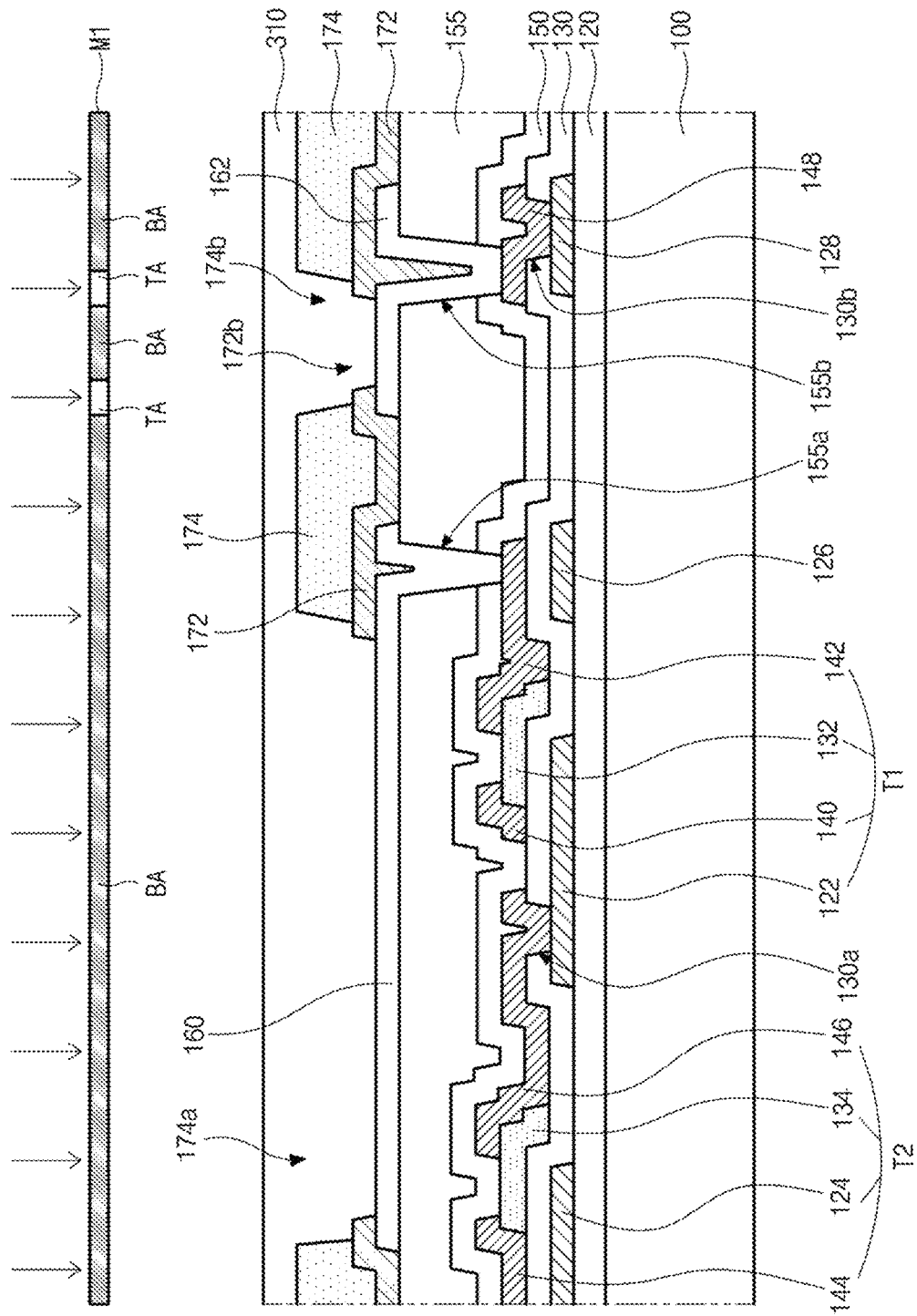

Next, in FIG. 6B, a first photoresist layer 310 is formed on the first and second banks 172 and 174 by applying photoresist. Then, a photomask M1 is disposed over the first photoresist layer 310, and the first photoresist layer 310 is exposed to light through the photomask M1.

The photomask M1 includes a light-transmitting portion TA and a light-blocking portion BA. The light-transmitting portion TA corresponds to the edges of the first and second auxiliary contact holes 172b and 174b, and the light-blocking portion BA corresponds to other areas. Here, the first photoresist layer 310 can have a positive photosensitivity.

Alternatively, first photoresist layer 310 can have a negative photosensitivity. At this time, in the photomask M1, the positions of the light-transmitting portion TA and the light-blocking portion BA are opposite to each other. That is, the light-blocking portion BA corresponds to the edges of the first and second auxiliary contact holes 172b and 174b, and the light-transmitting portion TA corresponds to other areas.

Figure 6C:
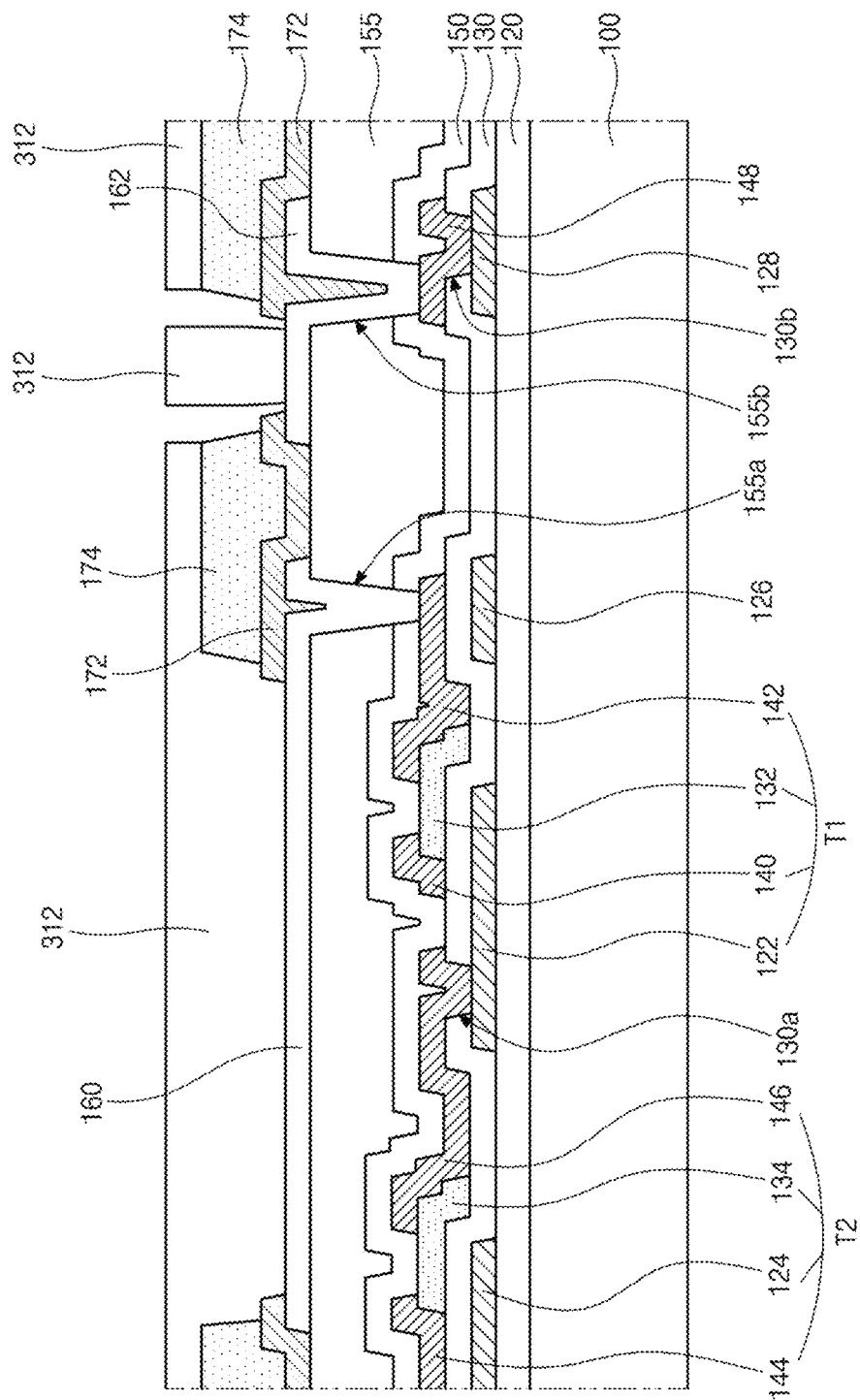

Next, in FIG. 6C, a first photoresist pattern 312 is formed by developing the first photoresist layer 310 of FIG. 6B exposed to the light. At this time, the first photoresist pattern 312 is disposed in an area corresponding to the light-blocking portion BA of the photomask M1 of FIG. 6B, and the edges of the first and second auxiliary contact holes 172b and 174b are exposed by the first photoresist pattern 312. Further, the first photoresist pattern 132 covers the connection pattern 152 exposed through the first and second auxiliary contact holes 172b and 174b.

Figure 6D:
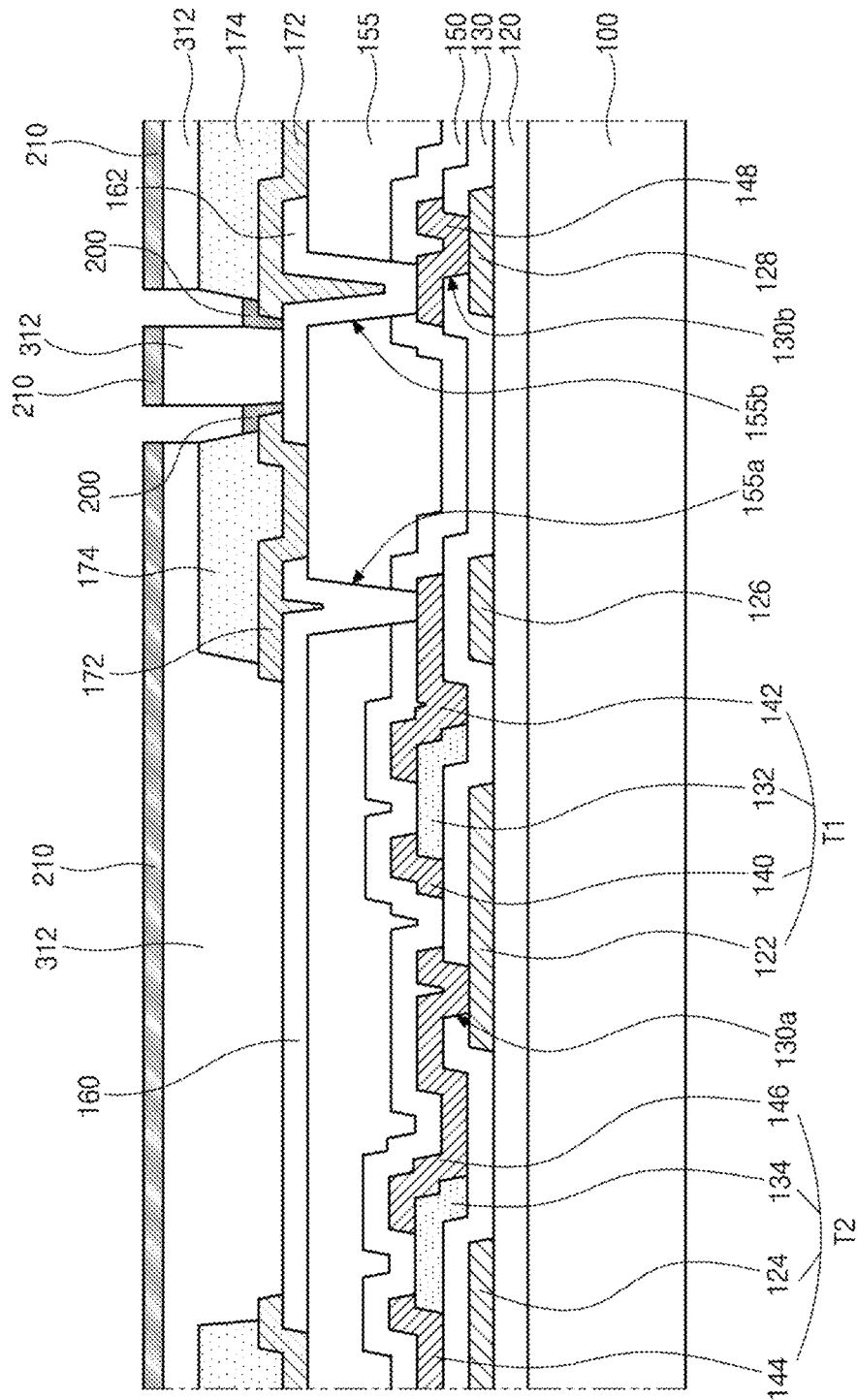

Next, in FIG. 6D, an auxiliary pattern 200 and a dummy pattern 210 are formed by depositing a conductive material on the first photoresist pattern 312. Here, the auxiliary pattern 200 is formed to correspond to the edges of the first and second auxiliary contact holes 172b and 174b. Namely, the auxiliary pattern 200 is formed between portions of the first photoresist pattern 312. In addition, the dummy pattern 210 is formed on the first photoresist pattern 312.

At this time, the side surfaces of the auxiliary pattern 200 can have an inclination angle equal to or greater than 75 degrees and smaller than 90 degrees. The inclination angle of the side surfaces of the auxiliary pattern 200 depends on an inclination angle of the side surfaces of the first photoresist pattern 312, and it is possible to control the inclination angle of the side surfaces of the first photoresist pattern 312 by changing an exposure angle in the light-exposing step of FIG. 6B.

Figure 6E:
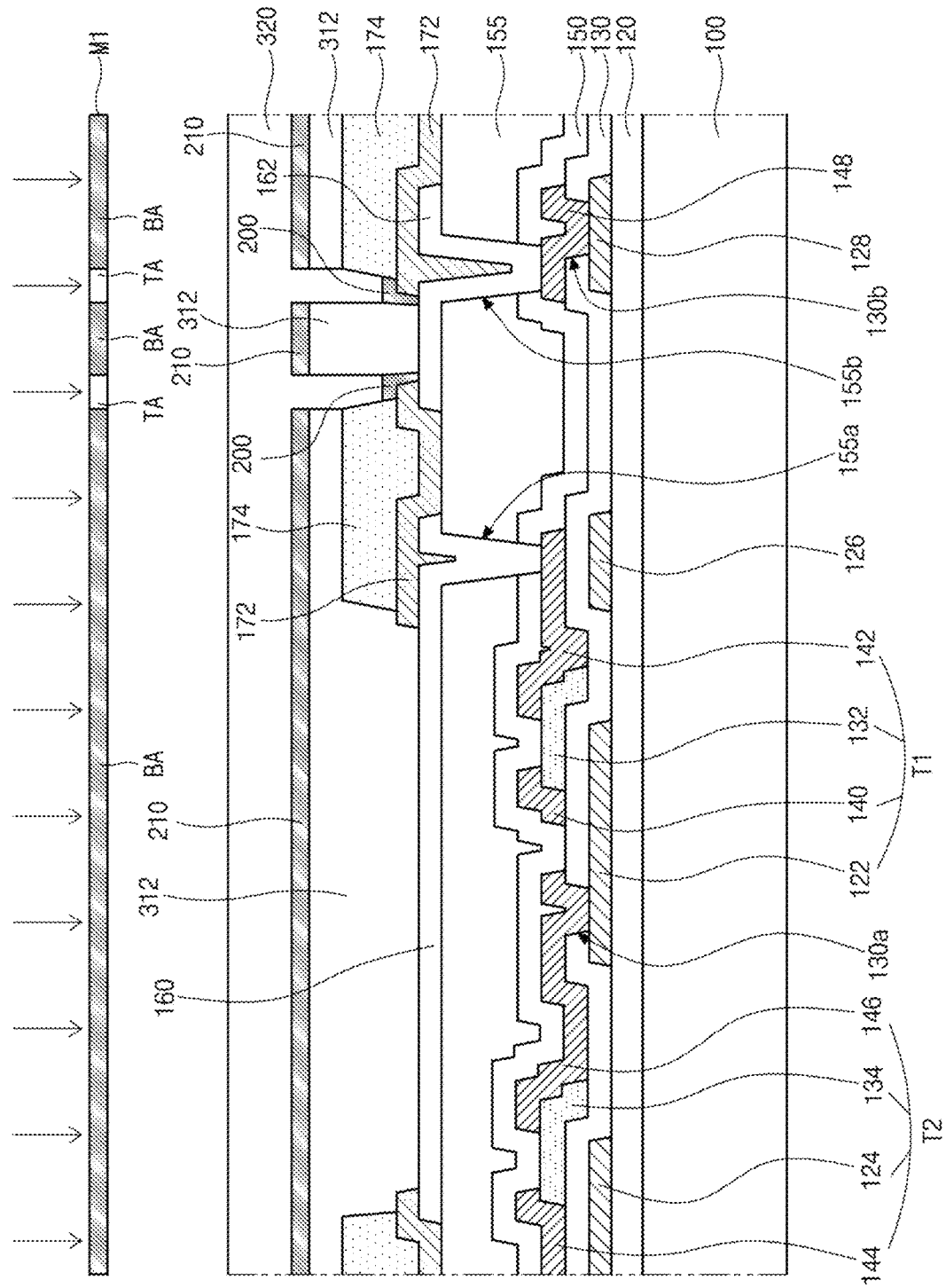

Next, in FIG. 6E, a second photoresist layer 320 is formed on the auxiliary pattern 200 and the dummy pattern 210 by applying photoresist. Then, a photomask M1 is disposed over the second photoresist layer 320, and the second photoresist layer 320 is exposed to light through the photomask M1.

At this time, the photomask M1 of FIG. 6E is the same as that the photomask M1 of FIG. 6B and includes the light-transmitting portion TA and the light-blocking portion BA. The light-transmitting portion TA corresponds to the edges of the first and second auxiliary contact holes 172b and 174b, and the light-blocking portion BA corresponds to other areas. Accordingly, the light-transmitting portion TA corresponds to the auxiliary pattern 200, and the light-blocking portion BA corresponds to the dummy pattern 210. Here, the second photoresist layer 320 can have a negative photosensitivity.

Alternatively, when the first photoresist layer 310 of FIG. 6B has a negative photosensitivity, the second photoresist layer 320 can have a positive photosensitivity.

Figure 6F:
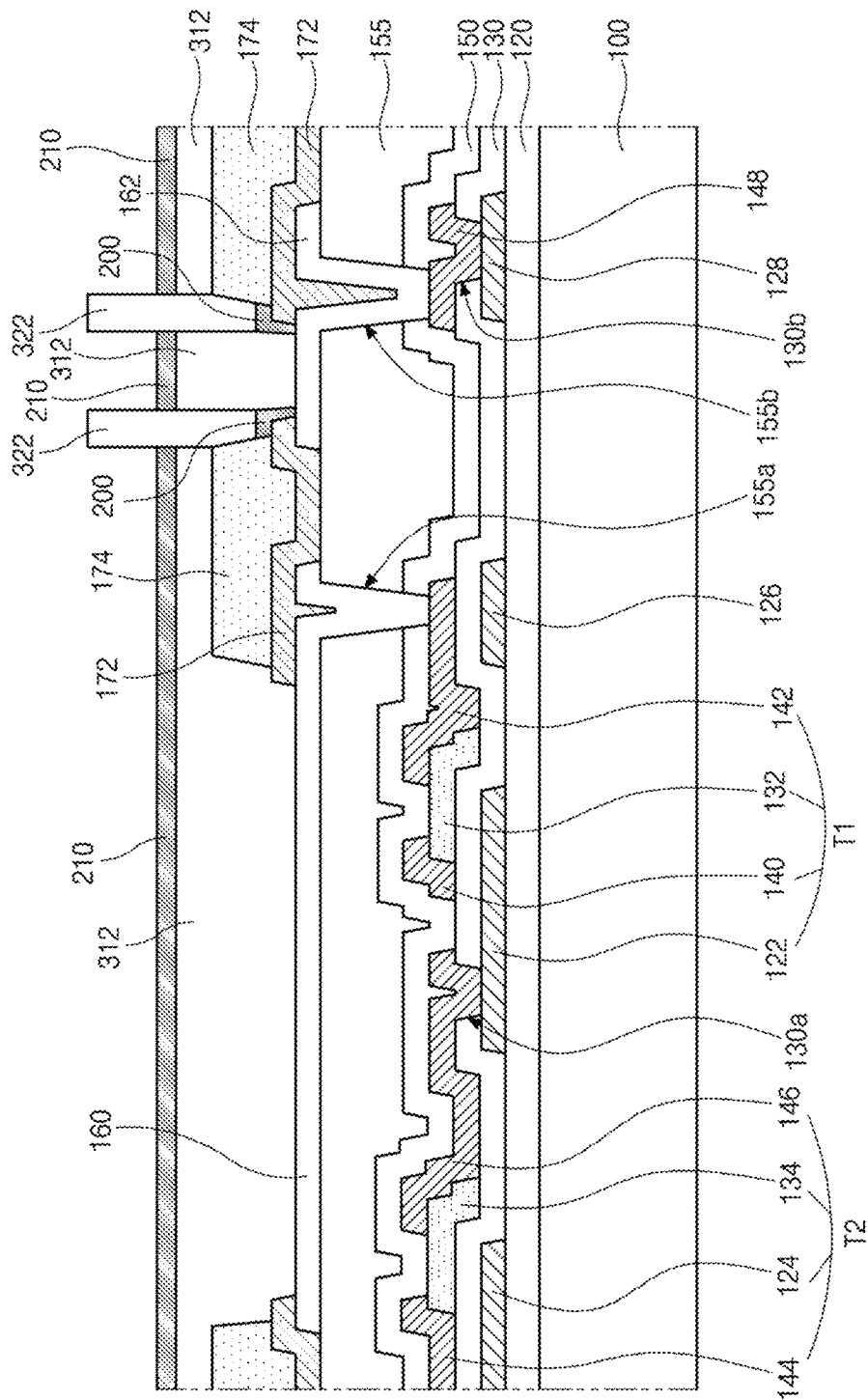

Next, in FIG. 6F, the second photoresist pattern 322 is formed by developing the second photoresist layer 320 of FIG. 6E exposed to the light. At this time, the second photoresist pattern 322 is disposed in an area corresponding to the light-transmitting portion TA of the photomask M1 of FIG. 6E. That is, the second photoresist pattern 322 is formed on the auxiliary pattern 200, and the dummy pattern 210 is exposed by the second photoresist pattern 322.

Figure 6G:
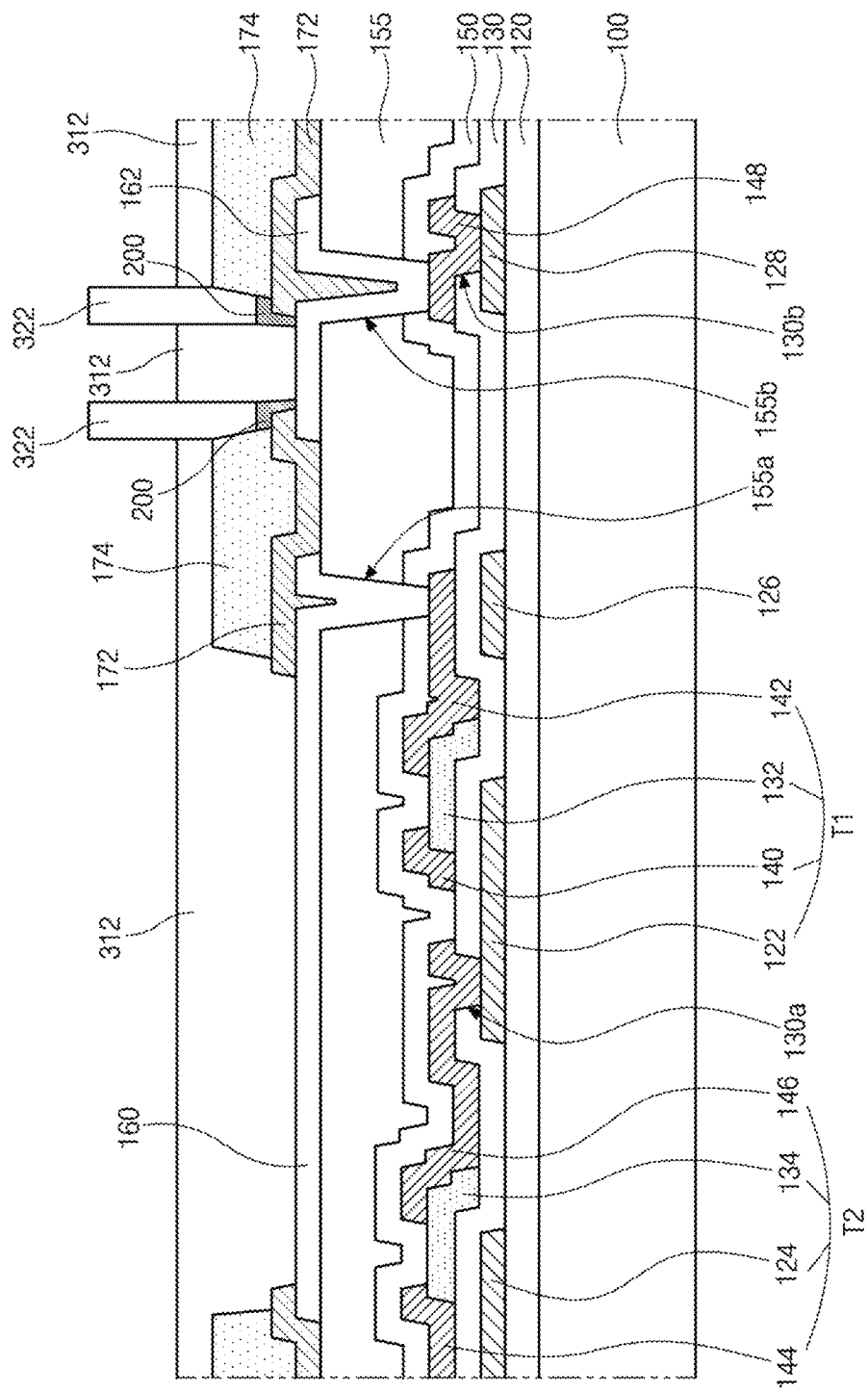

Then, in FIG. 6G, the first photoresist pattern 312 is exposed by removing the exposed dummy pattern 210 of FIG. 6F. At this time, the dummy pattern 210 of FIG. 6F can be removed through a wet etching process using etchant.

Figure 6H:
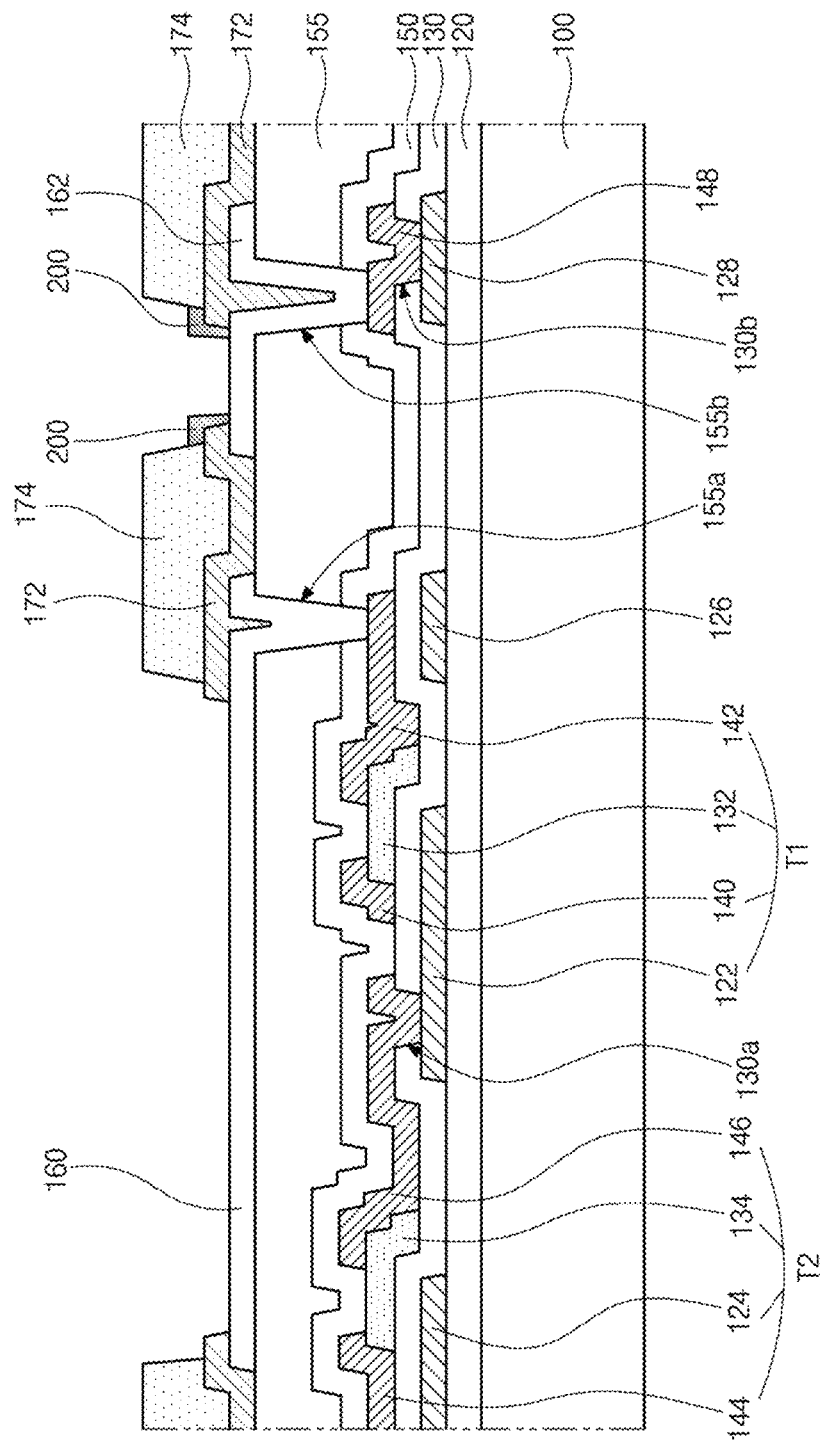

Next, in FIG. 6H, the auxiliary pattern 200 is exposed by removing the exposed first photoresist pattern 312 of FIG. 6G and the second photoresist pattern 322 of FIG. 6G. At this time, the first photoresist pattern 312 of FIG. 6G and the second photoresist pattern 322 of FIG. 6G can be removed through an ashing process, but is not limited thereto.

Figure 6I:
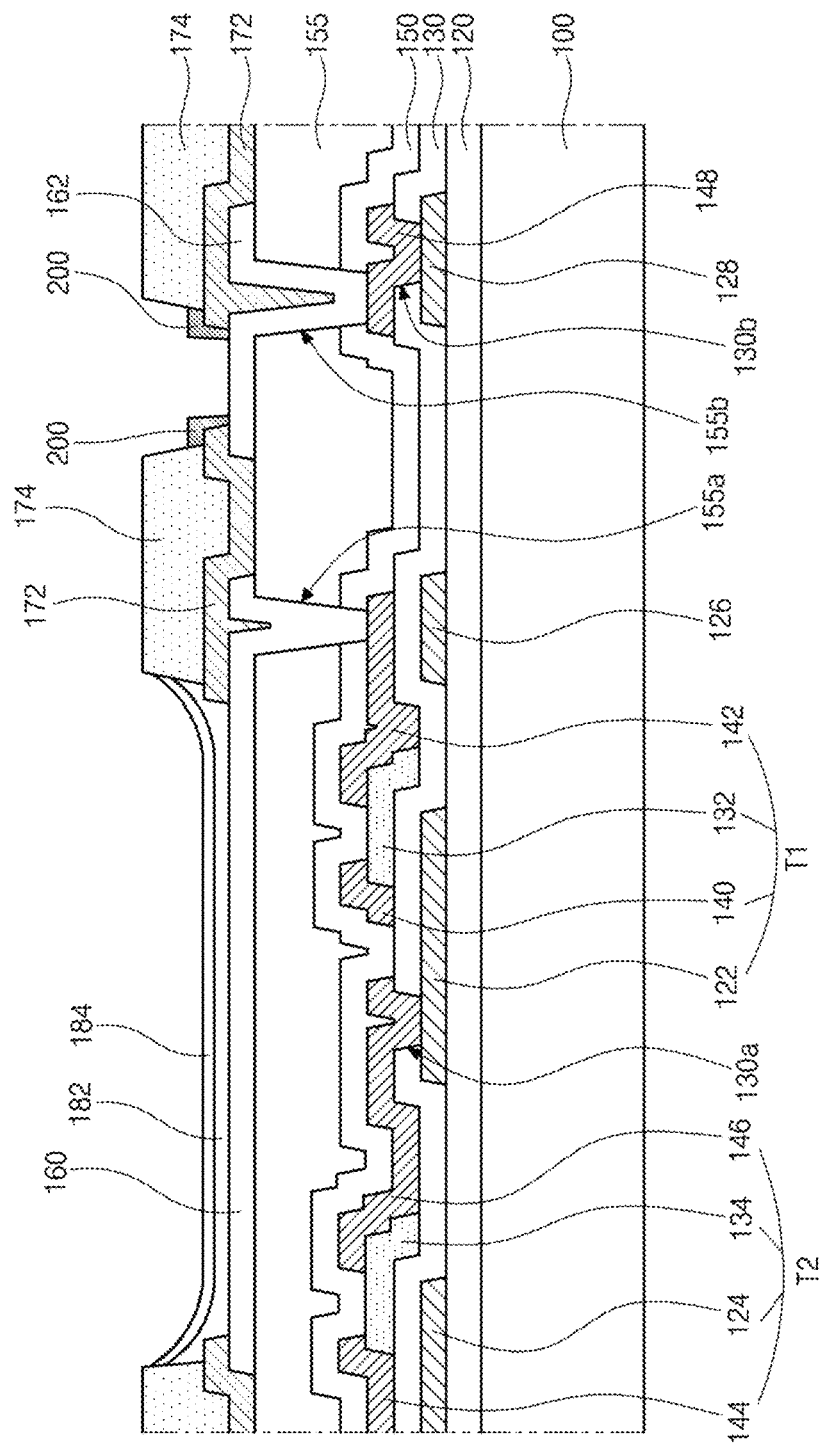

Next, in FIG. 6I, a first charge auxiliary layer 182 is formed on the first electrode 160 exposed by the second bank 174 by dropping a first solution and drying it. At least one side surface of the first charge auxiliary layer 182 is enclosed by the second bank 174. When the first solution is dried, a drying speed of a solvent in a region adjacent to the second bank 174 is different from that in other regions, and thus a height of the first charge auxiliary layer 182 in the region adjacent to the second bank 174 rises as it gets closer to the second bank 174.

The first charge auxiliary layer 182 can be a hole injecting layer (HIL) and/or a hole transporting layer (HTL).

Then, a light-emitting material layer 184 is formed on the first charge auxiliary layer 182 by dropping a second solution and drying it. At least one side surface of the light-emitting material layer 184 is enclosed by the second bank 174. When the second solution is dried, a drying speed of a solvent in a region adjacent to the second bank 174 is different from that in other regions, and thus a height of the light-emitting material layer 184 in the region adjacent to the second bank 174 rises as it gets closer to the second bank 174.

Figure 6J:
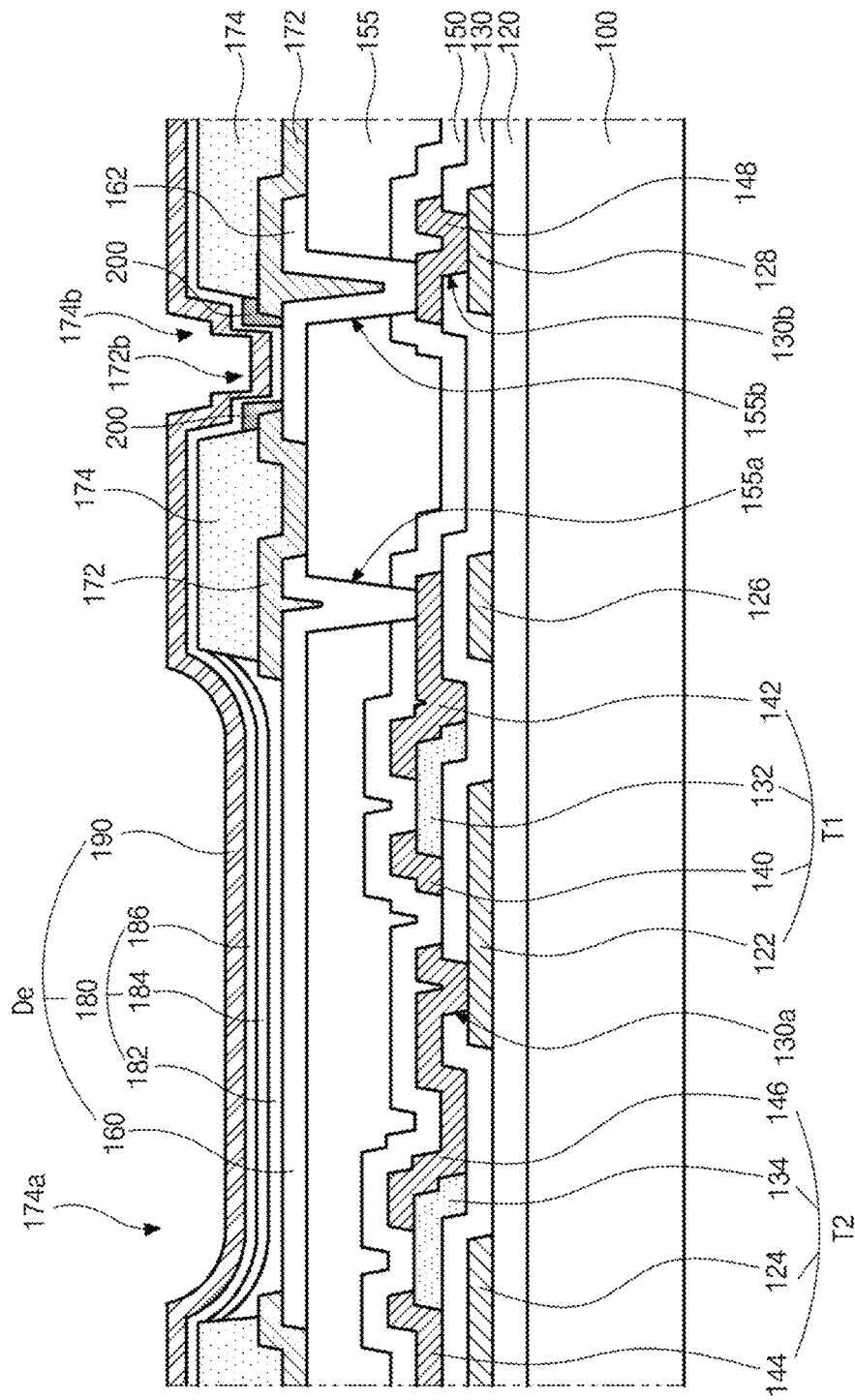

Next, in FIG. 6J, a second charge auxiliary layer 186 is formed on the light-emitting material layer 184 by depositing an organic material and/or an inorganic material. The second charge auxiliary layer 186 is formed substantially over the entire surface of the substrate 100. Accordingly, the second charge auxiliary layer 186 is also formed on the second bank 174, the connection pattern 162, and the auxiliary pattern 200.

At this time, due to a relatively large inclination angle of the side surfaces of the auxiliary pattern 200, the thickness of the second charge auxiliary layer 186 at the side surfaces of the auxiliary pattern 200 is smaller than the thickness of the second charge auxiliary layer 186 at other areas, for example, at the side and top surfaces of the second bank 174.

The second charge auxiliary layer 186 can be an electron injecting layer (EIL) and/or an electron transporting layer (ETL).

The first charge auxiliary layer 182, the light-emitting material layer 184, and the second charge auxiliary layer 186 constitute a light-emitting layer 180.

Then, a second electrode 190 is formed on the second charge auxiliary layer 186 by depositing a conductive material such as metal.

The first electrode 160, the light-emitting layer 180, and the second electrode 190 constitute a light-emitting diode De. The first electrode 160 can serve as an anode, and the second electrode 190 can serve as a cathode.

The second electrode 190 is formed substantially over the entire surface of the substrate 100. Accordingly, the second electrode 190 is also formed over the second bank 174, the connection pattern 162, and the auxiliary pattern 200.

Here, due to the relatively large inclination angle of the side surfaces of the auxiliary pattern 200, the thickness of the second electrode 190 at the side surfaces of the auxiliary pattern 200 can be smaller than the thickness of the second electrode 190 at other areas, for example, at the side and top surfaces of the second bank 174.

The second electrode 190 is electrically connected to the connection pattern 162 through the first and second auxiliary contact holes 172b and 174b. In addition, the second electrode 190 is electrically connected to the auxiliary pattern 200. At this time, since a distance between the second electrode 190 and the auxiliary pattern 200 is smaller than a distance between the second electrode 190 and the connection pattern 162 and the auxiliary pattern 200 is in contact with the connection pattern 162, the second electrode 190 can be electrically connected to the connection pattern 162 through the auxiliary pattern 200, and the contact resistance between the second electrode 190 and the connection pattern 162 can be reduced.

As described above, in the manufacturing method of the electroluminescent display device according to the first embodiment of the present disclosure, the auxiliary pattern 200 can be formed between the connection pattern 162 and the second charging auxiliary layer 186 without damage of the emission area where the light-emitting diode De is located, thereby improving the contact property between the second electrode 190 and the connection pattern 162. At this time, the manufacturing costs can be decreased by using the positive-type photoresist, the negative-type photoresist, and one photomask. However, the present disclosure is not limited thereto.

Alternatively, the first photoresist pattern 312 and the second photoresist pattern 322 can have the same photosensitivity and can be formed using different photomasks. At this time, the positions of the light-transmitting portion and the light-blocking portion of the photomask used for forming the first photoresist pattern 312 are opposite to the positions of the light-transmitting portion and the light-blocking portion of the photomask used for forming the second photoresist pattern 322.

Second Embodiment

Figure 7:
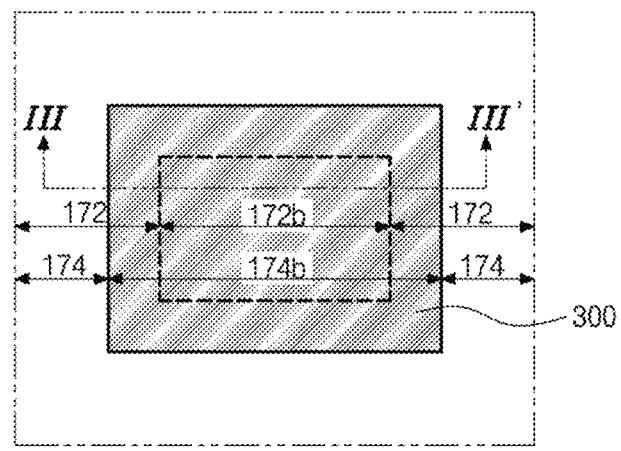
FIG. 7 is a schematic plan view enlarging an auxiliary pattern of an electroluminescent display device according to a second embodiment of the present disclosure corresponding to the area A1 of FIG. 3.
Figure 8:
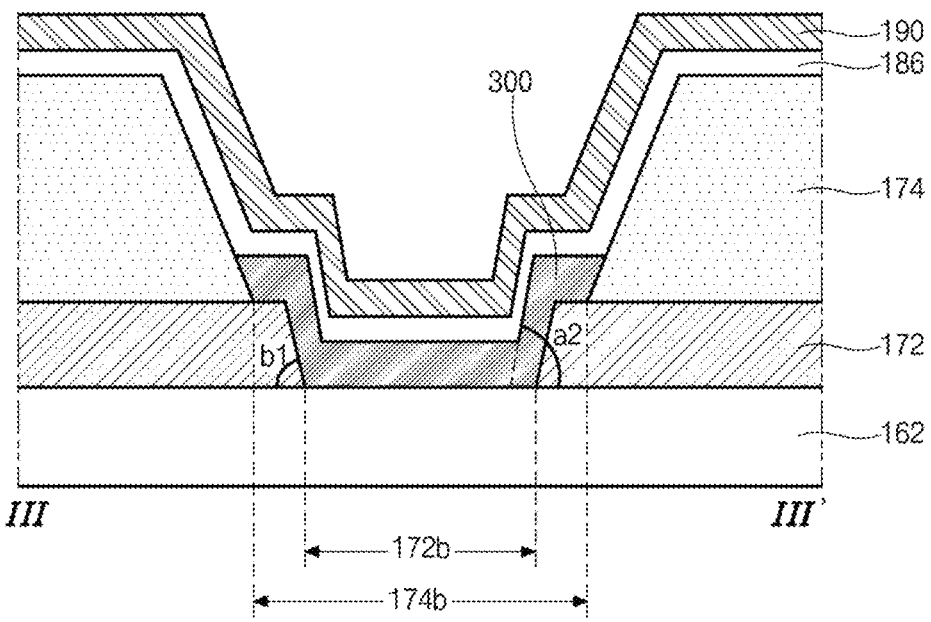
FIG. 8 is a cross-sectional view corresponding to the line of FIG. 7.

FIG. 7 and FIG. 8 are a schematic enlarged plan view and a schematic enlarged cross-sectional view corresponding to the area A1 of FIG. 3, respectively. FIG. 7 is a top view illustrating a planar structure of an auxiliary pattern in an electroluminescent display device according to a second embodiment of the present disclosure, and FIG. 8 is a cross-sectional view corresponding to the line of FIG. 7. The electroluminescent display device according to the second embodiment of the present disclosure has substantially the same configuration as that of the first embodiment except for the auxiliary pattern. The same parts as that of the first embodiment are designated by the same reference signs, and explanation for the same parts will be shortened or omitted.

In FIG. 7 and FIG. 8, the second charge auxiliary layer 186 is formed between the connection pattern 162 and the second electrode 190 corresponding to the first and second auxiliary contact holes 172b and 174b of the first and second banks 172 and 174, and an auxiliary pattern 300 is formed between the connection pattern 162 and the second charge auxiliary layer 186.

The auxiliary pattern 300 covers and contacts the connection pattern 162 exposed through the first and second auxiliary contact holes 172b and 174b and covers and contacts the side surfaces of the first bank 172. In addition, the auxiliary pattern 300 can contact the top surface of the first bank 172 and the side surfaces of the second bank 174. Alternatively, the auxiliary pattern 300 can be in contact with the top surface of the first bank 172 and spaced apart from the side surfaces of the second bank 174 or can be spaced apart from the top surface of the first bank 172 and the side surfaces of the second bank 174.

Here, the auxiliary pattern 300 is formed of a conductive material. For example, the auxiliary pattern 300 can be formed of a metal oxide such as ITO or IZO or formed of a metal having relatively low resistance under the atmosphere condition such as tungsten (W), chromium (Cr), titanium (Ti), molybdenum (Mo), nickel (Ni), or copper (Cu), but is not limited thereto.

In the present disclosure, the side surfaces of the auxiliary pattern 300 have a greater inclination angle than the side surfaces of the first bank 172. That is, the side surfaces of the auxiliary pattern 300 have a first inclination angle a2 with respect to the top surface of the connection pattern 162 parallel to the substrate 100 of FIG. 3, and the side surfaces of the first bank 172 have a second inclination angle b1 with respect to the top surface of the connection pattern 162 parallel to the substrate 100 of FIG. 3. The first inclination angle a2 is greater than the second inclination angle b1. The side surfaces of the auxiliary pattern 300 can have a normal inclination where the first inclination angle a2 is smaller than 90 degrees. For example, the first inclination angle a2 can be equal to or greater than 75 degrees and smaller than 90 degrees, but is not limited thereto.

In addition, the first inclination angle a2 of the side surfaces of the auxiliary pattern 300 can be greater than an inclination angle of the side surfaces of the second bank 174. At this time, the inclination angle of the side surfaces of the second bank 174 can be smaller than the second inclination angle b1 of the side surfaces of the first bank 172, but is not limited thereto.

Since the side surfaces of the auxiliary pattern 300 have relatively the large inclination angle, the thickness of the second charge auxiliary layer 186 at the side surfaces of the auxiliary pattern 300 is thinner than the thickness of the second charge auxiliary layer 186 at other portions. That is, the thickness of the second charge auxiliary layer 186 at the side surfaces of the auxiliary pattern 300 is smaller than the thickness of the second charge auxiliary layer 186 at the top and side surfaces of the second bank 174 and smaller than the thickness of the second charge auxiliary layer 186 on the top surface of the auxiliary pattern 300.

Accordingly, the thickness of the second charge auxiliary layer 186 between the auxiliary pattern 300 and the second electrode 190 at the side surfaces of the auxiliary pattern 300 is smaller than the thickness of the second charge auxiliary layer 186 between the connection pattern 162 and the second electrode 190. Namely, the distance between the auxiliary pattern 300 and the second electrode 190 at the side surfaces of the auxiliary pattern 300 is shorter than the distance between the connection pattern 162 and the second electrode 190. Since the contact resistance decreases as the distance between two conductive layers decreases, thereby resulting in an ohmic characteristic, the contact resistance between the auxiliary pattern 300 and the second electrode 190 is smaller than the contact resistance between the connection pattern 162 and the second electrode 190.

Accordingly, the auxiliary pattern 300 according to the second embodiment of the present disclosure shortens the distance from the second electrode 190 compared with the connection pattern 162 and contacts the connection pattern 162, so that the contact resistance between the second electrode 190 and the connection pattern 162 can be decreased.

It is beneficial that a height of the auxiliary pattern 300, that is, a distance from the top surface of the connection pattern 162 to the top surface of the auxiliary pattern 300 contacting the second bank 174 is greater than a sum of the thicknesses of the second charge auxiliary layer 186 and the second electrode 190. Further, a length of the side surfaces of the auxiliary pattern 300, that is, a distance from the top surface of the auxiliary pattern 300 contacting the connection pattern 162 to the top surface of the auxiliary pattern 300 contacting the second bank 174, desirably, is greater than the sum of the thicknesses of the second charge auxiliary layer 186 and the second electrode 190. For example, the length of the side surfaces of the auxiliary pattern 300 can be 1 μm to 1.5 μm, but is not limited thereto.

As described above, the electroluminescent display device according to the second embodiment of the present disclosure can be configured as the top emission type, thereby improving luminance and reducing power consumption. In addition, the second electrode 190 is connected to the first and second auxiliary electrodes 128 and 148 through the connection pattern 162, so that the resistance of the second electrode 190 can be decreased.

At this time, since the auxiliary pattern 300 of a conductive material is formed between the second electrode 190 and the connection pattern 162, more particularly, between the second charge auxiliary layer 186 and the connection pattern 162, it is possible to increase the contact property between the second electrode 190 and the connection pattern 162.

Third Embodiment

Figure 9:
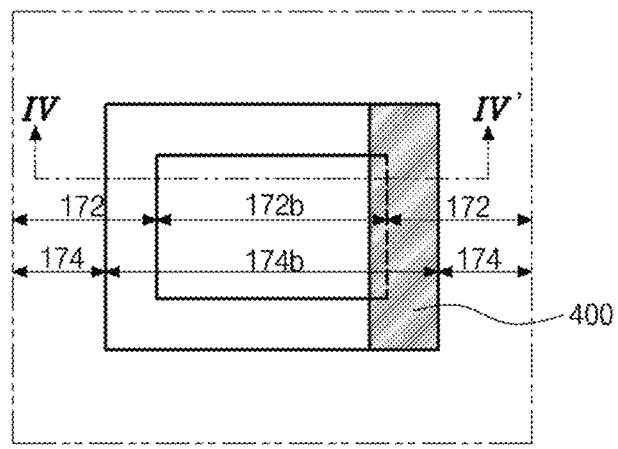
FIG. 9 is a schematic plan view enlarging an auxiliary pattern of an electroluminescent display device according to a third embodiment of the present disclosure corresponding to the area A1 of FIG. 3.
Figure 10:
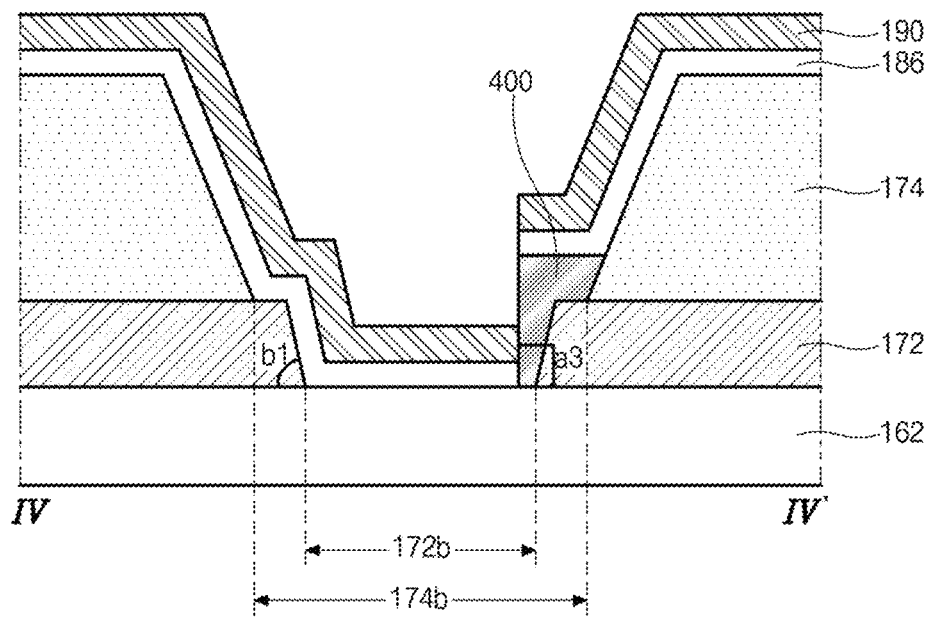
FIG. 10 is a cross-sectional view corresponding to the line IV-IV' of FIG. 9.

FIG. 9 and FIG. 10 are a schematic enlarged plan view and a schematic enlarged cross-sectional view corresponding to the area A1 of FIG. 3, respectively. FIG. 9 is a top view illustrating a planar structure of an auxiliary pattern in an electroluminescent display device according to a third embodiment of the present disclosure, and FIG. 10 is a cross-sectional view corresponding to the line IV-IV' of FIG. 9. The electroluminescent display device according to the third embodiment of the present disclosure has substantially the same configuration as that of the first embodiment except for the auxiliary pattern. The same parts as that of the first embodiment are designated by the same reference signs, and explanation for the same parts will be shortened or omitted.

In FIG. 9 and FIG. 10, the second charge auxiliary layer 186 is formed between the connection pattern 162 and the second electrode 190 corresponding to the first and second auxiliary contact holes 172b and 174b of the first and second banks 172 and 174, and an auxiliary pattern 400 is formed between the connection pattern 162 and the second charge auxiliary layer 186.

The auxiliary pattern 400 can be formed to correspond to one side of the first and second auxiliary contact holes 172b and 174b. The auxiliary pattern 400 contacts the connection pattern 162 and covers and contacts the corresponding side surface of the first bank 172. In addition, the auxiliary pattern 400 can contact the top surface of the first bank 172 and the corresponding side surface of the second bank 174. Alternatively, the auxiliary pattern 400 can be in contact with the top surface of the first bank 172 and spaced apart from the corresponding side surface of the second bank 174 or can be spaced apart from the top surface of the first bank 172 and the corresponding side surface of the second bank 174.

The auxiliary pattern 400 is formed along one edge of the first and second auxiliary contact holes 172b and 174b. Accordingly, the auxiliary pattern 400 exposes the connection pattern 162 exposed through the first and second auxiliary contact holes 172b and 174b.

Here, the auxiliary pattern 400 is formed of a conductive material. For example, the auxiliary pattern 400 can be formed of a metal oxide such as ITO or IZO or formed of a metal having relatively low resistance under the atmosphere condition such as tungsten (W), chromium (Cr), titanium (Ti), molybdenum (Mo), nickel (Ni), or copper (Cu), but is not limited thereto.

In the present disclosure, the side surface of the auxiliary pattern 400 has a greater inclination angle than the side surfaces of the first bank 172. That is, the side surface of the auxiliary pattern 400 has a first inclination angle a3 with respect to the top surface of the connection pattern 162 parallel to the substrate 100 of FIG. 3, and the side surfaces of the first bank 172 has a second inclination angle b1 with respect to the top surface of the connection pattern 162 parallel to the substrate 100 of FIG. 3. The first inclination angle a3 is greater than the second inclination angle b1. For example, the first inclination angle a3 can be 90 degrees, but is not limited thereto.

In addition, the first inclination angle a3 of the side surface of the auxiliary pattern 400 can be greater than an inclination angle of the side surfaces of the second bank 174. At this time, the inclination angle of the side surfaces of the second bank 174 can be smaller than the second inclination angle b1 of the side surfaces of the first bank 172, but is not limited thereto.

Since the side surface of the auxiliary pattern 400 has the first inclination angle a3 of 90 degrees, the second charge auxiliary layer 186 can be disconnected at the side surface of the auxiliary pattern 400. That is, the second charge auxiliary layer 186 may not be formed at the side surface of the auxiliary pattern 400, and the thickness of the second charge auxiliary layer 186 at the side surface of the auxiliary pattern 400 can be substantially thinner than the thickness of the second charge auxiliary layer 186 at other portions. Further, the second electrode 190 can be disconnected at the side surface of the auxiliary pattern 400.

On the other hand, the second charge auxiliary layer 186 and the second electrode 190 on the connection pattern 162 exposed through the first and second auxiliary contact holes 172b and 174b are in contact with the side surface of the auxiliary pattern 400.

Accordingly, the second electrode 190 is in direct contact with the auxiliary pattern 400, and the auxiliary pattern 400 is in direct contact with the connection pattern 162, so that the auxiliary pattern 400 according to the third embodiment of the present disclosure can reduce the contact resistance between the second electrode 190 and the connection pattern 162.

It is beneficial that a height of the auxiliary pattern 400, that is, a distance from the top surface of the connection pattern 162 to the top surface of the auxiliary pattern 400 contacting the second bank 174 is greater than a sum of the thicknesses of the second charge auxiliary layer 186 and the second electrode 190. For example, the height of the auxiliary pattern 400 can be 1 μm to 1.5 μm, but is not limited thereto.

As described above, the electroluminescent display device according to the third embodiment of the present disclosure can be configured as the top emission type, thereby improving luminance and reducing power consumption. In addition, the second electrode 190 is connected to the first and second auxiliary electrodes 128 and 148 through the connection pattern 162, so that the resistance of the second electrode 190 can be decreased.

At this time, since the auxiliary pattern 400 of a conductive material is formed between the second electrode 190 and the connection pattern 162, more particularly, between the second charge auxiliary layer 186 and the connection pattern 162 and the auxiliary pattern 400 is in direct contact with the second electrode 190 and the connection pattern 162, it is possible to increase the contact property between the second electrode 190 and the connection pattern 162.

Meanwhile, in the third embodiment, it is described that the auxiliary pattern 400 is formed at one side of the first and second auxiliary contact holes 172b and 174b, but is not limited thereto. Alternatively, the auxiliary pattern 400 can be formed to correspond to other edges of the first and second auxiliary contact holes 172b and 174b except for the edge of at least one side.

Fourth Embodiment

Figure 11:
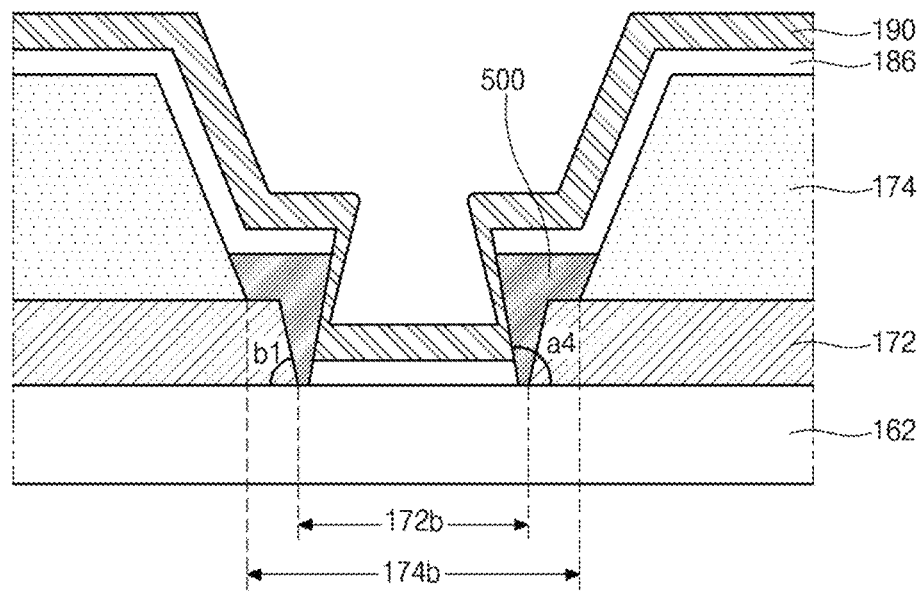
FIG. 11 is a schematic plan view enlarging an auxiliary pattern of an electroluminescent display device according to a fourth embodiment of the present disclosure corresponding to the area A1 of FIG. 3.

FIG. 11 is a schematic enlarged cross-sectional view corresponding to the area A1 of FIG. 3 and shows a connection structure of a second electrode and a connection pattern in an electroluminescent display device according to a fourth embodiment of the present disclosure. The electroluminescent display device according to the fourth embodiment of the present disclosure has substantially the same planar structure as that of the electroluminescent display device according to the first embodiment of FIG. 4. The electroluminescent display device according to the fourth embodiment of the present disclosure has substantially the same configuration as that of the first embodiment except for the auxiliary pattern. The same parts as that of the first embodiment are designated by the same reference signs, and explanation for the same parts will be shortened or omitted.

In FIG. 11, the second charge auxiliary layer 186 is formed between the connection pattern 162 and the second electrode 190 corresponding to the first and second auxiliary contact holes 172b and 174b of the first and second banks 172 and 174, and an auxiliary pattern 500 is formed between the connection pattern 162 and the second charge auxiliary layer 186.

The auxiliary pattern 500 is formed on the first and second banks 172 and 174 corresponding to the first and second auxiliary contact holes 172b and 174b. The auxiliary pattern 500 contacts the connection pattern 162 and covers and contacts the side surfaces of the first bank 172. In addition, the auxiliary pattern 500 can contact the top surface of the first bank 172 and the side surfaces of the second bank 174. Alternatively, the auxiliary pattern 500 can be in contact with the top surface of the first bank 172 and spaced apart from the side surfaces of the second bank 174 or can be spaced apart from the top surface of the first bank 172 and the side surfaces of the second bank 174.

The auxiliary pattern 500 is formed along edges of the first and second auxiliary contact holes 172b and 174b. Accordingly, the auxiliary pattern 500 exposes the connection pattern 162 exposed through the first and second auxiliary contact holes 172b and 174b.

Here, the auxiliary pattern 500 is formed of a conductive material. For example, the auxiliary pattern 500 can be formed of a metal oxide such as ITO or IZO or formed of a metal having relatively low resistance under the atmosphere condition such as tungsten (W), chromium (Cr), titanium (Ti), molybdenum (Mo), nickel (Ni), or copper (Cu), but is not limited thereto.

In the present disclosure, the side surfaces of the auxiliary pattern 500 have a greater inclination angle than the side surfaces of the first bank 172. That is, the side surfaces of the auxiliary pattern 500 have a first inclination angle a4 with respect to the top surface of the connection pattern 162 parallel to the substrate 100 of FIG. 3, and the side surfaces of the first bank 172 have a second inclination angle b1 with respect to the top surface of the connection pattern 162 parallel to the substrate 100 of FIG. 3. The first inclination angle a4 is greater than the second inclination angle b1. The side surfaces of the auxiliary pattern 500 can have a reverse inclination where the first inclination angle a4 is greater than 90 degrees. For example, the first inclination angle a4 can be greater than 90 degrees and smaller than 105 degrees, but is not limited thereto.

In addition, the first inclination angle a4 of the side surfaces of the auxiliary pattern 500 can be greater than an inclination angle of the side surfaces of the second bank 174. At this time, the inclination angle of the side surfaces of the second bank 174 can be smaller than the second inclination angle b1 of the side surfaces of the first bank 172, but is not limited thereto.

Since the side surfaces of the auxiliary pattern 500 have the reverse inclination, the second charge auxiliary layer 186 can be disconnected at the side surfaces of the auxiliary pattern 500. That is, the second charge auxiliary layer 186 may not be formed at the side surfaces of the auxiliary pattern 500, and the thickness of the second charge auxiliary layer 186 at the side surfaces of the auxiliary pattern 500 can be substantially thinner than the thickness of the second charge auxiliary layer 186 at other portions.

On the other hand, the second electrode 190 can be formed at the side surfaces of the auxiliary pattern 500 as well as on the top and side surfaces of the second bank 174 and the top surface of the auxiliary pattern 500. At this time, the thickness of the second electrode 190 at the side surfaces of the auxiliary pattern 500 can be thinner than the thickness of the second electrode 190 at other portions. The second electrode 190 can be formed by adjusting an angle between the deposition source and the target substrate.

In the fourth embodiment of the present disclosure, since the second charge auxiliary layer 186 is disconnected at the side surfaces of the auxiliary pattern 500 and the second electrode 190 is formed at the side surfaces of the auxiliary pattern 500, the second electrode 190 is in contact with the side surfaces of the auxiliary pattern 500.

Accordingly, the second electrode 190 is in direct contact with the auxiliary pattern 500, and the auxiliary pattern 500 is in direct contact with the connection pattern 162, so that the auxiliary pattern 500 according to the fourth embodiment of the present disclosure can reduce the contact resistance between the second electrode 190 and the connection pattern 162.

It is beneficial that a height of the auxiliary pattern 500, that is, a distance from the top surface of the connection pattern 162 to the top surface of the auxiliary pattern 500 contacting the second bank 174 is greater than a sum of the thicknesses of the second charge auxiliary layer 186 and the second electrode 190. For example, the height of the auxiliary pattern 500 can be 1 μm to 1.5 μm, but is not limited thereto.

As described above, the electroluminescent display device according to the fourth embodiment of the present disclosure can be configured as the top emission type, thereby improving luminance and reducing power consumption. In addition, the second electrode 190 is connected to the first and second auxiliary electrodes 128 and 148 through the connection pattern 162, so that the resistance of the second electrode 190 can be decreased.

At this time, since the auxiliary pattern 500 of a conductive material is formed between the second electrode 190 and the connection pattern 162, more particularly, between the second charge auxiliary layer 186 and the connection pattern 162 and the auxiliary pattern 500 is in direct contact with the second electrode 190 and the connection pattern 162, it is possible to increase the contact property between the second electrode 190 and the connection pattern 162.

In the fourth embodiment of the present disclosure, it is described that the second charge auxiliary layer 186 is not formed at the side surfaces of the auxiliary pattern 500, but is not limited thereto. That is, the second charge auxiliary layer 186 can be formed at the side surfaces of the auxiliary pattern 500, and in this case, the thickness of the second charge auxiliary layer 186 at the side surfaces of the auxiliary pattern 500 is thinner than the thickness of the second charge auxiliary layer 186 at other portions. Accordingly, the distance between the auxiliary pattern 500 and the second electrode 190 is shorter than the distance between the connection pattern 162 and the second electrode 190, so that the contact property between the second electrode 190 and the connection pattern 162 can be improved by the auxiliary pattern 500.

Meanwhile, in the fourth embodiment of the present disclosure, it is described that the auxiliary pattern 500 exposes the connection pattern 162 exposed through the first and second auxiliary contact holes 172b and 174b, but is not limited thereto. Alternatively, the auxiliary pattern 500 can completely cover and contact the connection pattern 162 exposed through the first and second auxiliary contact holes 172b and 174b.

Fifth Embodiment

Figure 12:
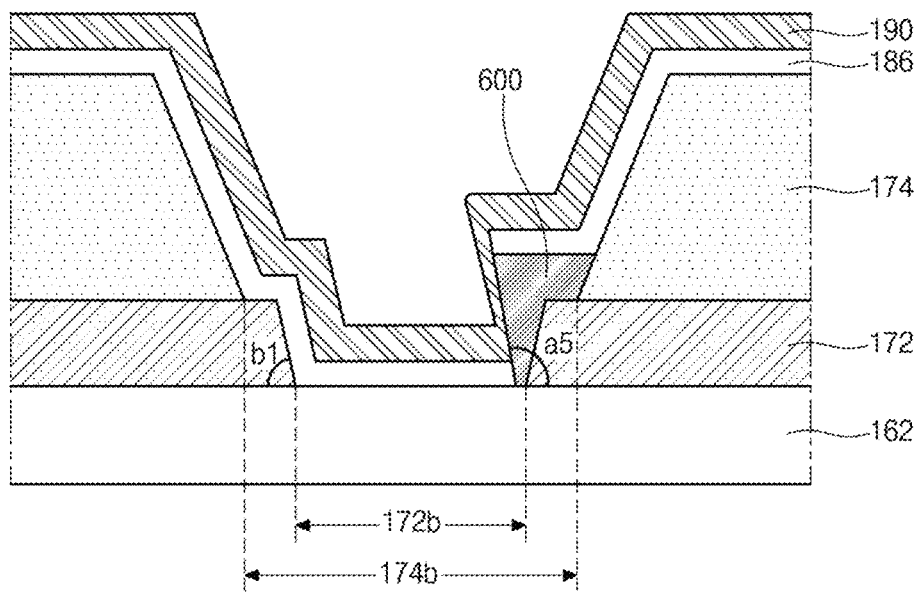
FIG. 12 is a schematic plan view enlarging an auxiliary pattern of an electroluminescent display device according to a fifth embodiment of the present disclosure corresponding to the area A1 of FIG. 3.

FIG. 12 is a schematic enlarged cross-sectional view corresponding to the area A1 of FIG. 3 and shows a connection structure of a second electrode and a connection pattern in an electroluminescent display device according to a fifth embodiment of the present disclosure. The electroluminescent display device according to the fifth embodiment of the present disclosure has substantially the same planar structure as that of the electroluminescent display device according to the third embodiment of FIG. 9. The electroluminescent display device according to the fifth embodiment of the present disclosure has substantially the same configuration as that of the first embodiment except for the auxiliary pattern. The same parts as that of the first embodiment are designated by the same reference signs, and explanation for the same parts will be shortened or omitted.

In FIG. 12, the second charge auxiliary layer 186 is formed between the connection pattern 162 and the second electrode 190 corresponding to the first and second auxiliary contact holes 172b and 174b of the first and second banks 172 and 174, and an auxiliary pattern 600 is formed between the connection pattern 162 and the second charge auxiliary layer 186.

The auxiliary pattern 600 can be formed to correspond to one side of the first and second auxiliary contact holes 172b and 174b. The auxiliary pattern 600 contacts the connection pattern 162 and covers and contacts the corresponding side surface of the first bank 172. In addition, the auxiliary pattern 600 can contact the top surface of the first bank 172 and the corresponding side surface of the second bank 174. Alternatively, the auxiliary pattern 600 can be in contact with the top surface of the first bank 172 and spaced apart from the corresponding side surface of the second bank 174 or can be spaced apart from the top surface of the first bank 172 and the corresponding side surface of the second bank 174.

The auxiliary pattern 600 is formed along one edge of the first and second auxiliary contact holes 172b and 174b. Accordingly, the auxiliary pattern 600 exposes the top surface of the connection pattern 162 exposed through the first and second auxiliary contact holes 172b and 174b.

Here, the auxiliary pattern 600 is formed of a conductive material. For example, the auxiliary pattern 600 can be formed of a metal oxide such as ITO or IZO or formed of a metal having relatively low resistance under the atmosphere condition such as tungsten (W), chromium (Cr), titanium (Ti), molybdenum (Mo), nickel (Ni), or copper (Cu), but is not limited thereto.

In the present disclosure, the side surface of the auxiliary pattern 600 has a greater inclination angle than the side surfaces of the first bank 172. That is, the side surface of the auxiliary pattern 600 has a first inclination angle a5 with respect to the top surface of the connection pattern 162 parallel to the substrate 100 of FIG. 3, and the side surfaces of the first bank 172 have a second inclination angle b1 with respect to the top surface of the connection pattern 162 parallel to the substrate 100 of FIG. 3. The first inclination angle a5 is greater than the second inclination angle b1. The side surface of the auxiliary pattern 600 can have a reverse inclination where the first inclination angle a5 is greater than 90 degrees. For example, the first inclination angle a5 can be greater than 90 degrees and smaller than 105 degrees, but is not limited thereto.

In addition, the first inclination angle a5 of the side surface of the auxiliary pattern 600 can be greater than an inclination angle of the side surfaces of the second bank 174. At this time, the inclination angle of the side surfaces of the second bank 174 can be smaller than the second inclination angle b1 of the side surfaces of the first bank 172, but is not limited thereto.

Since the side surface of the auxiliary pattern 600 has the reverse inclination, the second charge auxiliary layer 186 can be disconnected at the side surface of the auxiliary pattern 600. That is, the second charge auxiliary layer 186 may not be formed at the side surface of the auxiliary pattern 600, and the thickness of the second charge auxiliary layer 186 at the side surface of the auxiliary pattern 600 can be substantially thinner than the thickness of the second charge auxiliary layer 186 at other portions.

On the other hand, the second electrode 190 can be formed at the side surface of the auxiliary pattern 600 as well as on the top and side surfaces of the second bank 174 and the top surface of the auxiliary pattern 600. At this time, the thickness of the second electrode 190 at the side surface of the auxiliary pattern 600 can be thinner than the thickness of the second electrode 190 at other portions. The second electrode 190 can be formed by adjusting an angle between the deposition source and the target substrate.

In the fifth embodiment of the present disclosure, since the second charge auxiliary layer 186 is disconnected at the side surface of the auxiliary pattern 600 and the second electrode 190 is formed at the side surface of the auxiliary pattern 600, the second electrode 190 is in contact with the side surface of the auxiliary pattern 600.

Accordingly, the second electrode 190 is in direct contact with the auxiliary pattern 600, and the auxiliary pattern 600 is in direct contact with the connection pattern 162, so that the auxiliary pattern 600 according to the fifth embodiment of the present disclosure can reduce the contact resistance between the second electrode 190 and the connection pattern 162.

It is beneficial that a height of the auxiliary pattern 600, that is, a distance from the top surface of the connection pattern 162 to the top surface of the auxiliary pattern 600 contacting the second bank 174 is greater than a sum of the thicknesses of the second charge auxiliary layer 186 and the second electrode 190. For example, the height of the auxiliary pattern 600 can be 1 µm to 1.5 µm, but is not limited thereto.

As described above, the electroluminescent display device according to the fifth embodiment of the present disclosure can be configured as the top emission type, thereby improving luminance and reducing power consumption. In addition, the second electrode 190 is connected to the first and second auxiliary electrodes 128 and 148 through the connection pattern 162, so that the resistance of the second electrode 190 can be decreased.

At this time, since the auxiliary pattern 600 of a conductive material is formed between the second electrode 190 and the connection pattern 162, more particularly, between the second charge auxiliary layer 186 and the connection pattern 162 and the auxiliary pattern 600 is in direct contact with the second electrode 190 and the connection pattern 162, it is possible to increase the contact property between the second electrode 190 and the connection pattern 162.

In the fifth embodiment of the present disclosure, it is described that the second charge auxiliary layer 186 is not formed at the side surface of the auxiliary pattern 600, but is not limited thereto. That is, the second charge auxiliary layer 186 can be formed at the side surface of the auxiliary pattern 600, and in this case, the thickness of the second charge auxiliary layer 186 at the side surface of the auxiliary pattern 600 is thinner than the thickness of the second charge auxiliary layer 186 at other portions. Accordingly, the distance between the auxiliary pattern 600 and the second electrode 190 is shorter than the distance between the connection pattern 162 and the second electrode 190, so that the contact property between the second electrode 190 and the connection pattern 162 can be improved by the auxiliary pattern 600.

Meanwhile, in the fifth embodiment of the present disclosure, it is described that the auxiliary pattern 600 is formed at one side of the first and second auxiliary contact holes 172b and 174b, but is not limited thereto. Alternatively, the auxiliary pattern 600 can be formed to correspond to other edges of the first and second auxiliary contact holes 172b and 174b except for the edge of at least one side.

Sixth Embodiment

Figure 13:
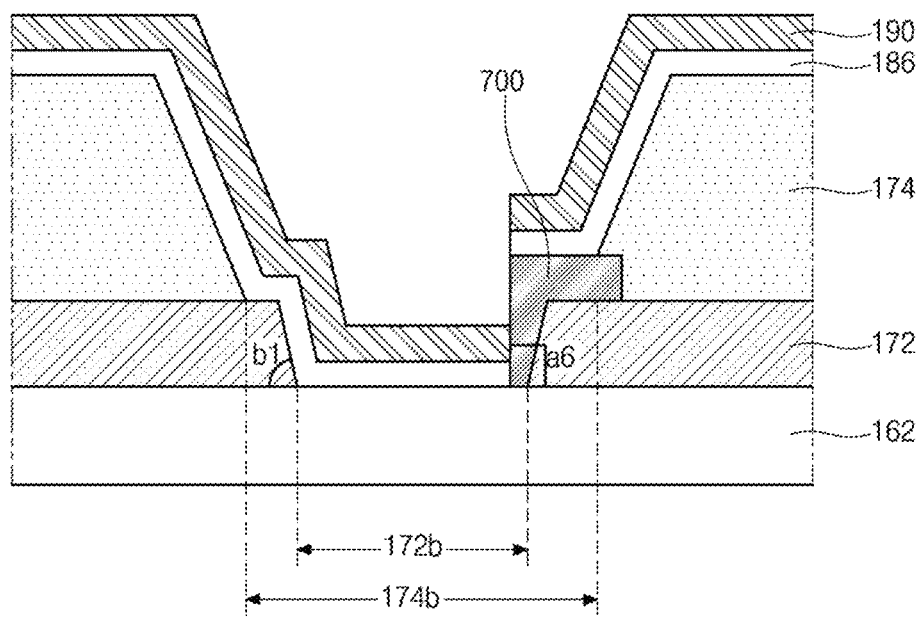
FIG. 13 is a schematic plan view enlarging an auxiliary pattern of an electroluminescent display device according to a sixth embodiment of the present disclosure corresponding to the area A1 of FIG. 3.

FIG. 13 is a schematic enlarged cross-sectional view corresponding to the area A1 of FIG. 3 and shows a connection structure of a second electrode and a connection pattern in an electroluminescent display device according to a sixth embodiment of the present disclosure. The electroluminescent display device according to the sixth embodiment of the present disclosure has substantially the same planar structure as that of the electroluminescent display device according to the third embodiment of FIG. 9. The electroluminescent display device according to the sixth embodiment of the present disclosure has substantially the same configuration as that of the first embodiment except for the auxiliary pattern. The same parts as that of the first embodiment are designated by the same reference signs, and explanation for the same parts will be shortened or omitted.

In FIG. 13, the second charge auxiliary layer 186 is formed between the connection pattern 162 and the second electrode 190 corresponding to the first and second auxiliary contact holes 172b and 174b of the first and second banks 172 and 174, and an auxiliary pattern 700 is formed between the connection pattern 162 and the second charge auxiliary layer 186.

The auxiliary pattern 700 can be formed to correspond to one side of the first and second auxiliary contact holes 172b and 174b. At this time, the auxiliary pattern 700 can be formed between the first bank 172 and the second bank 174. Accordingly, the auxiliary pattern 700 contacts the connection pattern 162 and covers and contacts the corresponding side surface of the first bank 172. In addition, the auxiliary pattern 700 can contact the top surface of the first bank 172 and the bottom surface of the second bank 174.

The auxiliary pattern 700 is formed along one edge of the first and second auxiliary contact holes 172b and 174b. Accordingly, the auxiliary pattern 700 exposes the top surface of the connection pattern 162 exposed through the first and second auxiliary contact holes 172b and 174b.

Here, the auxiliary pattern 700 is formed of a conductive material. For example, the auxiliary pattern 700 can be formed of a metal oxide such as ITO or IZO or formed of a metal having relatively low resistance under the atmosphere condition such as tungsten (W), chromium (Cr), titanium (Ti), molybdenum (Mo), nickel (Ni), or copper (Cu), but is not limited thereto.

In the present disclosure, the side surface of the auxiliary pattern 700 has a greater inclination angle than the side surfaces of the first bank 172. That is, the side surface of the auxiliary pattern 700 has a first inclination angle a6 with respect to the top surface of the connection pattern 162 parallel to the substrate 100 of FIG. 3, and the side surfaces of the first bank 172 have a second inclination angle b1 with respect to the top surface of the connection pattern 162 parallel to the substrate 100 of FIG. 3. The first inclination angle a6 is greater than the second inclination angle b1. For example, the first inclination angle a6 can be 90 degrees, but is not limited thereto.

In addition, the first inclination angle a6 of the side surface of the auxiliary pattern 700 can be greater than an inclination angle of the side surfaces of the second bank 174. At this time, the inclination angle of the side surfaces of the second bank 174 can be smaller than the second inclination angle b1 of the side surfaces of the first bank 172, but is not limited thereto.

Since the side surface of the auxiliary pattern 700 has the reverse inclination, the second charge auxiliary layer 186 can be disconnected at the side surface of the auxiliary pattern 700. That is, the second charge auxiliary layer 186 may not be formed at the side surface of the auxiliary pattern 700, and the thickness of the second charge auxiliary layer 186 at the side surface of the auxiliary pattern 700 can be substantially thinner than the thickness of the second charge auxiliary layer 186 at other portions. Further, the second electrode 190 can be disconnected at the side surface of the auxiliary pattern 700.

However, the second charge auxiliary layer 186 and the second electrode 190 formed on the connection pattern 162 exposed through the first and second auxiliary contact holes 172b and 174b are in contact with the side surface of the auxiliary pattern 700.

Accordingly, the second electrode 190 is in direct contact with the auxiliary pattern 700, and the auxiliary pattern 700 is in direct contact with the connection pattern 162, so that the auxiliary pattern 700 according to the sixth embodiment of the present disclosure can reduce the contact resistance between the second electrode 190 and the connection pattern 162.

It is beneficial that a height of the auxiliary pattern 700, that is, a distance from the top surface of the connection pattern 162 to the top surface of the auxiliary pattern 700 contacting the second bank 174 is greater than a sum of the thicknesses of the second charge auxiliary layer 186 and the second electrode 190. For example, the height of the auxiliary pattern 700 can be 1 μm to 1.5 μm, but is not limited thereto.

As described above, the electroluminescent display device according to the sixth embodiment of the present disclosure can be configured as the top emission type, thereby improving luminance and reducing power consumption. In addition, the second electrode 190 is connected to the first and second auxiliary electrodes 128 and 148 through the connection pattern 162, so that the resistance of the second electrode 190 can be decreased.

At this time, since the auxiliary pattern 700 of a conductive material is formed between the second electrode 190 and the connection pattern 162, more particularly, between the second charge auxiliary layer 186 and the connection pattern 162 and the auxiliary pattern 700 is in direct contact with the second electrode 190 and the connection pattern 162, it is possible to increase the contact property between the second electrode 190 and the connection pattern 162.

In the sixth embodiment of the present disclosure, it is described that the side surface of the auxiliary pattern 700 formed between the first and second banks 172 and 174 has the first inclination angle a6 of 90 degrees, but is not limited thereto. That is, the side surface of the auxiliary pattern 700 formed between the first and second banks 172 and 174 can have a normal inclination as described in the first and second embodiments or can have a reverse inclination as described in the fourth and fifth embodiments.

Meanwhile, in the sixth embodiment of the present disclosure, it is described that the auxiliary pattern 700 is formed at one side of the first and second auxiliary contact holes 172b and 174b, but is not limited thereto. Alternatively, the auxiliary pattern 700 can be formed to correspond to other edges of the first and second auxiliary contact holes 172b and 174b except for the edge of at least one side.

In the present disclosure, by forming the light-emitting layer of each sub-pixel through the solution process, a mask is omitted to thereby reduce the manufacturing costs, and a display device with a large size and high definition can be implemented.

In addition, the light-emitting layers in pixel regions adjacent along one direction, for example, the light-emitting layers of the same color sub-pixels are connected to each other and formed as one body, thereby reducing or minimizing the deviation in the dropping amount between nozzles and uniformly forming the thicknesses of the light-emitting layers of the sub-pixels. Therefore, the mura is prevented, thereby effectively preventing the image quality of the display device from being lowered.

Moreover, the second electrode is connected to the auxiliary electrode through the connection pattern, thereby lowering the resistance of the second electrode, and the auxiliary pattern is formed between the second electrode and the connection pattern, thereby improving the electrical contact property between the second electrode and the connection pattern.

The auxiliary pattern can be applied to various structures by controlling the inclination of the side surface thereof.

It will be apparent to those skilled in the art that various modifications and variations can be made in the electroluminescent display device of the present disclosure without departing from the sprit or scope of the embodiment. Thus, it is intended that the present disclosure covers the modifications and variations of this disclosure provided they come within the scope of the appended claims and their equivalents.

What is claimed is:

1. An electroluminescent display device comprising:
   a substrate;
   a first electrode on the substrate;
   a connection pattern on the substrate and formed of a same material as the first electrode;
   a bank covering edges of the first electrode and the connection pattern;
   a light-emitting layer on the first electrode;
   a second electrode on the light-emitting layer, the bank, and the connection pattern; and
   a conductive pattern between the second electrode and the connection pattern, wherein a side surface of the conductive pattern has a greater inclination angle than a side surface of the bank, and the conductive pattern is in contact with the side surface of the bank.

2. The electroluminescent display device of claim 1, wherein the light-emitting layer includes a first charge auxiliary layer, a light-emitting material layer, and a second charge auxiliary layer, at least one side surface of each of the first charge auxiliary layer and the light-emitting material layer is enclosed by the bank, and a part of the second charge auxiliary layer is disposed between the bank and the second electrode and between the conductive pattern and the second electrode, and wherein a thickness of the second charge auxiliary layer at the side surface of the conductive pattern is smaller than a thickness of the second charge auxiliary layer at the side surface of the bank.

3. The electroluminescent display device of claim 1, wherein the conductive pattern exposes the connection pattern.

4. The electroluminescent display device of claim 1, wherein the bank has a contact hole exposing the connection pattern, and the conductive pattern completely covers the connection pattern exposed through the contact hole.

5. The electroluminescent display device of claim 1, wherein the bank has a contact hole exposing the connection pattern, and the conductive pattern is formed to correspond to at least one side of the contact hole.

6. The electroluminescent display device of claim 1, wherein the second electrode is in contact with the side surface of the conductive pattern.

7. The electroluminescent display device of claim 1, wherein a thickness of the second electrode at the side surface of the conductive pattern is smaller than a thickness of the second electrode at the side surface of the bank.

8. The electroluminescent display device of claim 1, wherein the side surface of the conductive pattern has the inclination angle of 75 degrees to 105 degrees.

9. The electroluminescent display device of claim 1, further comprising at least one thin film transistor between the substrate and the first electrode, wherein the first electrode is connected to the at least one thin film transistor.

10. The electroluminescent display device of claim 1, wherein the bank includes a first bank of a hydrophilic property and a second bank of a hydrophobic property.

11. The electroluminescent display device of claim 10, wherein the hydrophilic first bank and the hydrophobic second bank are formed of a same material, and are connected to each other and formed as one body.

12. The electroluminescent display device of claim 10, wherein the conductive pattern is disposed between the first bank and the second bank.

13. The electroluminescent display device of claim 10, wherein the light-emitting layers in pixel regions adjacent along one direction are connected to each other to thereby form one body.

14. An electroluminescent display device comprising:
a substrate;
a first electrode on the substrate;
a connection pattern on the substrate and formed of a same material as the first electrode;
a bank covering edges of the first electrode and the connection pattern;
a light-emitting layer on the first electrode;
a second electrode on the light-emitting layer, the bank, and the connection pattern; and
a conductive pattern between the second electrode and the connection pattern,
wherein the light-emitting layer includes a first charge auxiliary layer, a light-emitting material layer, and a second charge auxiliary layer, and the second charge auxiliary layer is disposed between the conductive pattern and the second electrode, and
wherein a thickness of the second charge auxiliary layer at a side surface of the conductive pattern is smaller than a thickness of the second charge auxiliary layer at a side surface of the bank, and the conductive pattern is in contact with the side surface of the bank.

15. The electroluminescent display device of claim 14, wherein the conductive pattern exposes the connection pattern.

16. The electroluminescent display device of claim 14, wherein the bank has a contact hole exposing the connection pattern, and the conductive pattern completely covers the connection pattern exposed through the contact hole.

17. The electroluminescent display device of claim 14, wherein the bank has a contact hole exposing the connection pattern, and the conductive pattern is formed to correspond to at least one side of the contact hole.

18. The electroluminescent display device of claim 14, wherein the second electrode is in contact with the side surface of the conductive pattern.

19. The electroluminescent display device of claim 14, wherein a thickness of the second electrode at the side surface of the conductive pattern is smaller than a thickness of the second electrode at the side surface of the bank.

20. The electroluminescent display device of claim 14, wherein the side surface of the conductive pattern has an inclination angle of 75 degrees to 105 degrees.

21. The electroluminescent display device of claim 1, wherein a top surface of the conductive pattern has a greater width than a bottom surface of the conductive pattern.

22. The electroluminescent display device of claim 21, wherein the light-emitting layer includes a first charge auxiliary layer, a light-emitting material layer, and a second charge auxiliary layer, and wherein the top surface of the conductive pattern is in contact with the second charge auxiliary layer, and the bottom surface of the conductive pattern is in contact with the connection pattern.

* * * * *